US009915881B2

(12) United States Patent
Miyajima et al.

(10) Patent No.: US 9,915,881 B2
(45) Date of Patent: Mar. 13, 2018

(54) LITHOGRAPHY APPARATUS AND ARTICLE MANUFACTURING METHOD

(71) Applicant: CANON KABUSHIKI KAISHA, Tokyo (JP)

(72) Inventors: Yoshikazu Miyajima, Utsunomiya (JP); Hitoshi Nakano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/730,568

(22) Filed: Jun. 4, 2015

(65) Prior Publication Data
US 2015/0355558 A1    Dec. 10, 2015

(30) Foreign Application Priority Data

Jun. 6, 2014    (JP) .................................. 2014-118132

(51) Int. Cl.
G03B 27/04    (2006.01)
G03F 7/20    (2006.01)
G03F 7/00    (2006.01)

(52) U.S. Cl.
CPC ........ *G03F 7/70741* (2013.01); *G03F 7/0002* (2013.01); *G03F 7/7035* (2013.01); *G03F 7/7075* (2013.01); *G03F 7/70691* (2013.01); *G03F 7/70991* (2013.01)

(58) Field of Classification Search
CPC ............... G03F 7/0002; G03F 7/70691; G03F 7/70716; G03F 7/70725; G03F 7/70733–7/7075; G03F 7/70991; G03F 7/7035; G03F 7/70375; G03F 5/14; G03F 7/2047; G03G 15/225

USPC ............ 355/46, 72–77, 78, 84, 89, 95, 132; 250/492.1, 492.2, 492.22, 492.21, 493.1, 250/548

See application file for complete search history.

(56) References Cited

U.S. PATENT DOCUMENTS

| 4,878,086 | A | * | 10/1989 | Isohata | .................... | G03F 7/20 355/53 |
|---|---|---|---|---|---|---|
| 8,143,602 | B2 | | 3/2012 | Chen et al. | | |
| 8,663,488 | B2 | | 3/2014 | Kido | | |

(Continued)

FOREIGN PATENT DOCUMENTS

| CN | 101063828 | | 10/2007 |
|---|---|---|---|
| CN | 101350290 | A | 1/2009 |

(Continued)

OTHER PUBLICATIONS

English translation of JP 2012-009830, published on Jan. 12, 2012.*

(Continued)

*Primary Examiner* — Christina Riddle
(74) *Attorney, Agent, or Firm* — Rossi, Kimms & McDowell LLP

(57) ABSTRACT

A lithography apparatus includes an original conveying path, a substrate conveying path, and a plurality of patterning devices each configured to perform patterning on a substrate using an original. The plurality of patterning devices are arranged in two rows. The substrate conveying path is provided between and along the two rows. The original conveying path is provided in each of two rows between and along which the two rows of the patterning devices are arranged.

10 Claims, 26 Drawing Sheets

(56) References Cited

U.S. PATENT DOCUMENTS

| | | | |
|---|---|---|---|
| 2002/0024647 A1 | 2/2002 | Nakahara et al. | |
| 2003/0218730 A1* | 11/2003 | Murakami | G03F 7/7005 355/53 |
| 2004/0223132 A1* | 11/2004 | Nishi | G03F 7/70741 355/75 |
| 2006/0012771 A1 | 1/2006 | Jeong | |
| 2007/0013890 A1* | 1/2007 | Loopstra | G03F 7/70208 355/69 |
| 2007/0200276 A1* | 8/2007 | MacKey | B82Y 10/00 264/293 |
| 2012/0086142 A1* | 4/2012 | Terada | B29C 33/58 264/39 |
| 2012/0109364 A1 | 5/2012 | Harada et al. | |
| 2012/0212715 A1* | 8/2012 | Beerens | G03F 7/70691 355/53 |
| 2014/0098354 A1 | 4/2014 | Chang | |
| 2014/0271083 A1 | 9/2014 | Caveney | |

FOREIGN PATENT DOCUMENTS

| | | | |
|---|---|---|---|
| CN | 101846885 A | 9/2010 | |
| JP | H11329937 A | 11/1999 | |
| JP | 2006041485 A | 2/2006 | |
| JP | 2009059992 A | 3/2009 | |
| JP | 2011210992 A | 10/2011 | |
| JP | 2012006380 A | 1/2012 | |
| JP | 2012009830 A | 1/2012 | |
| KR | 1020060007211 A | 1/2006 | |
| WO | 0051172 A1 | 8/2000 | |
| WO | 2013072760 A2 | 5/2013 | |

OTHER PUBLICATIONS

Office Action issued in Chinese Patent Application No. 201510293935.8 dated Mar. 8, 2017. English translation provided.

Office Action issued in Korean Appln. No. 10-2015-0076148 dated Oct. 18, 2016. English translation provided.

Office Action issued in Japanese Appln. No. 2014-118132 dated Aug. 25, 2017. English translation provided.

* cited by examiner

F I G. 11
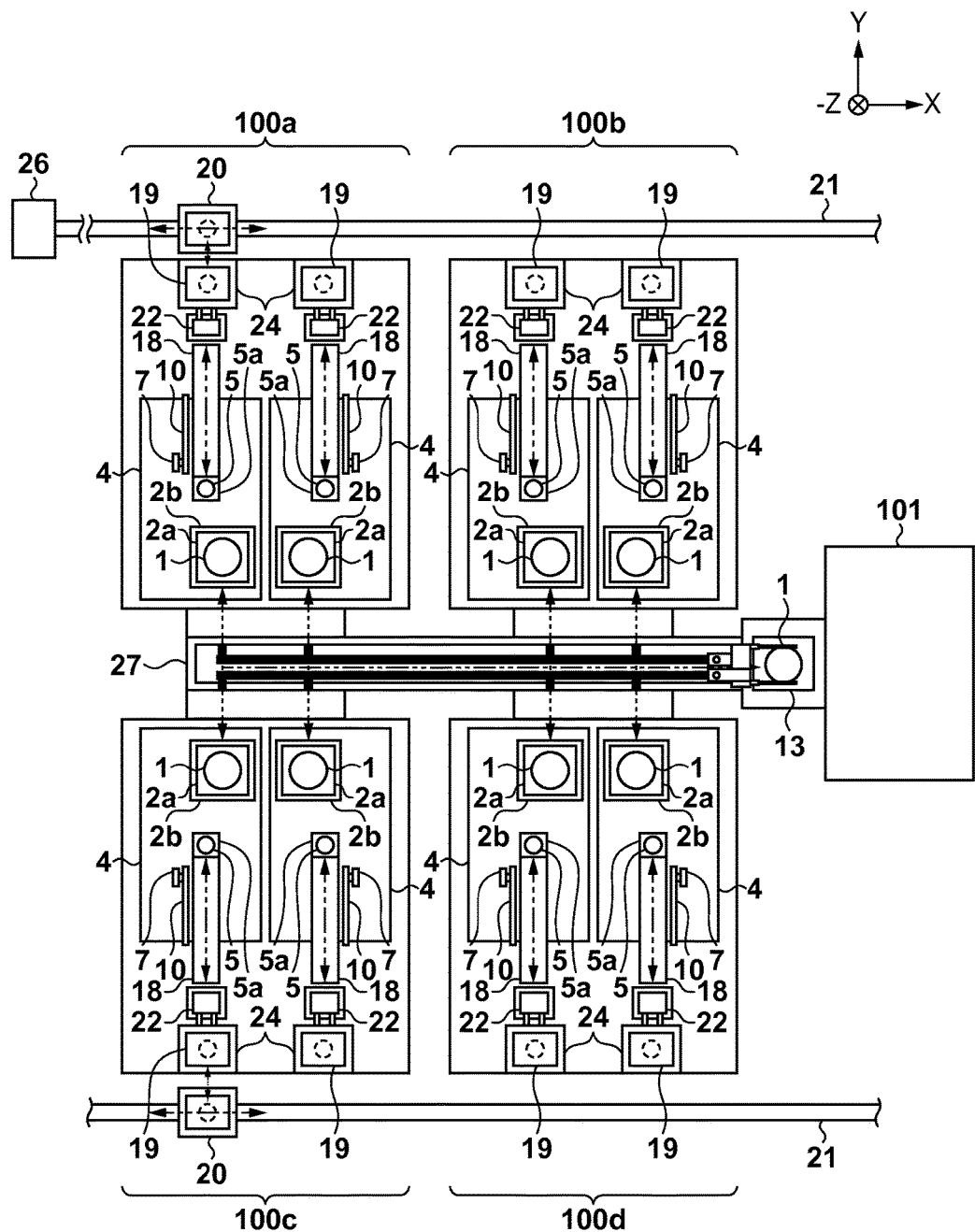

F I G. 14A
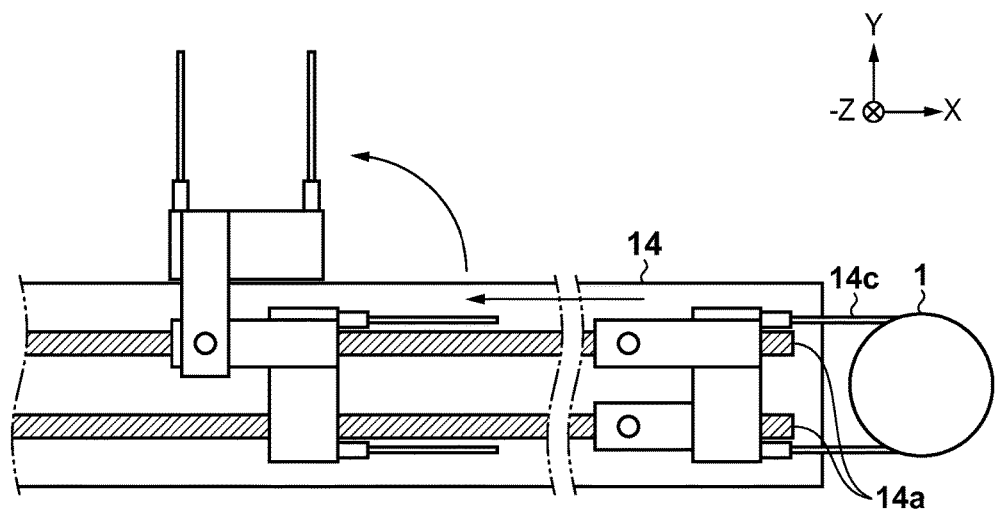
F I G. 14B
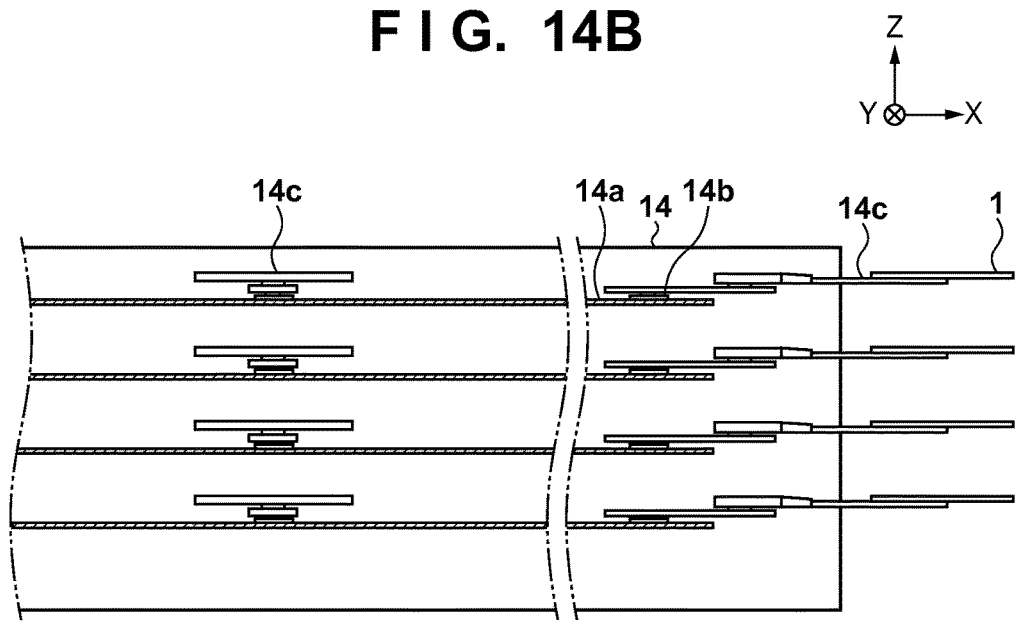

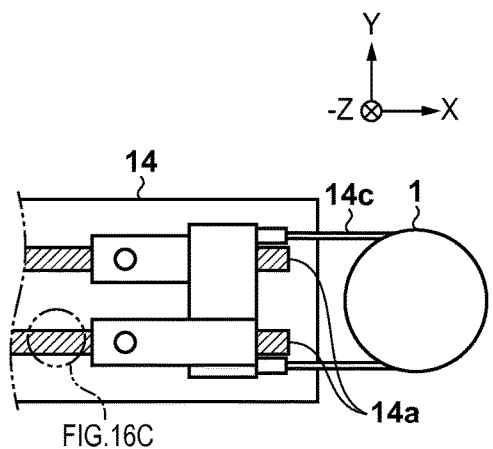
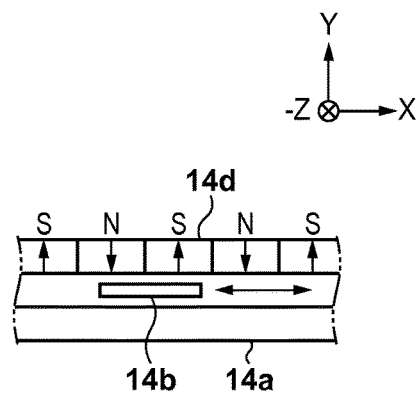
FIG. 16A
FIG. 16C
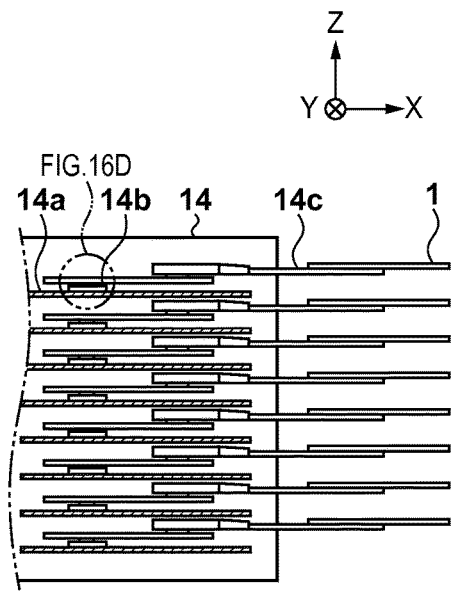
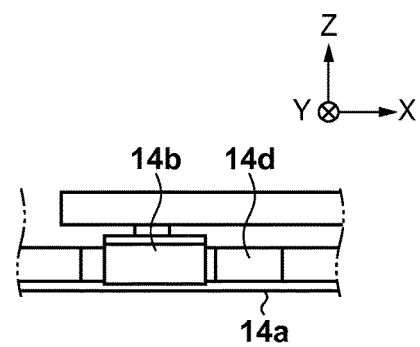
FIG. 16B
FIG. 16D

F I G. 20A
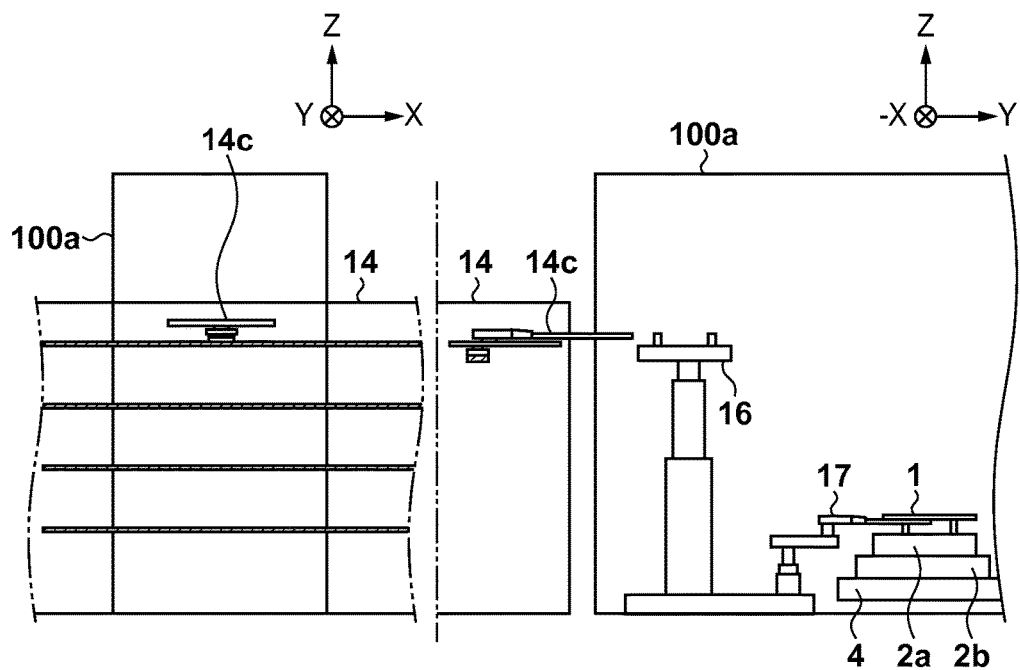
F I G. 20B
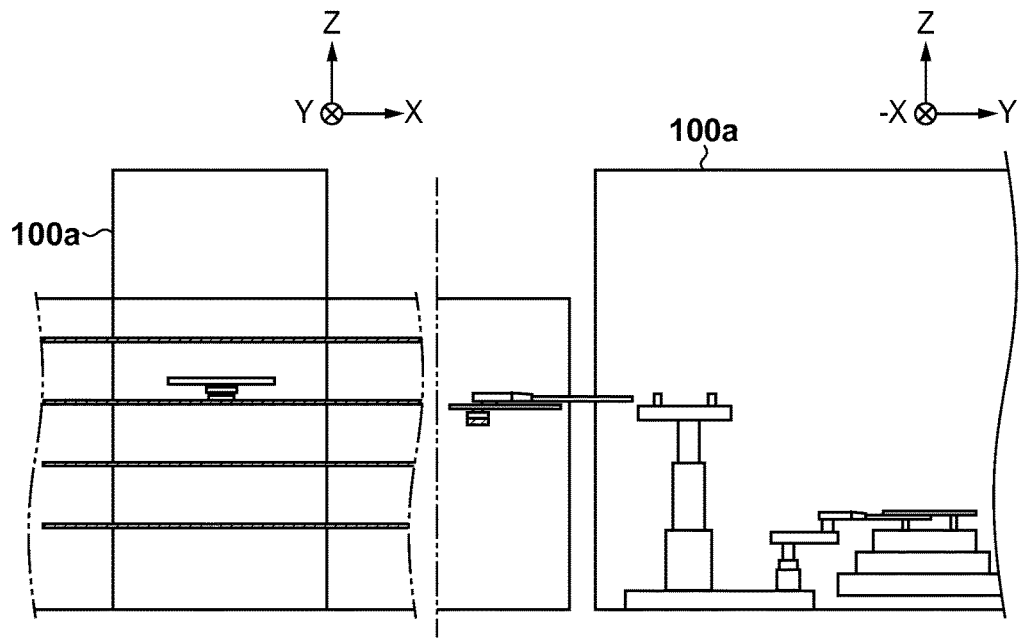

F I G. 21
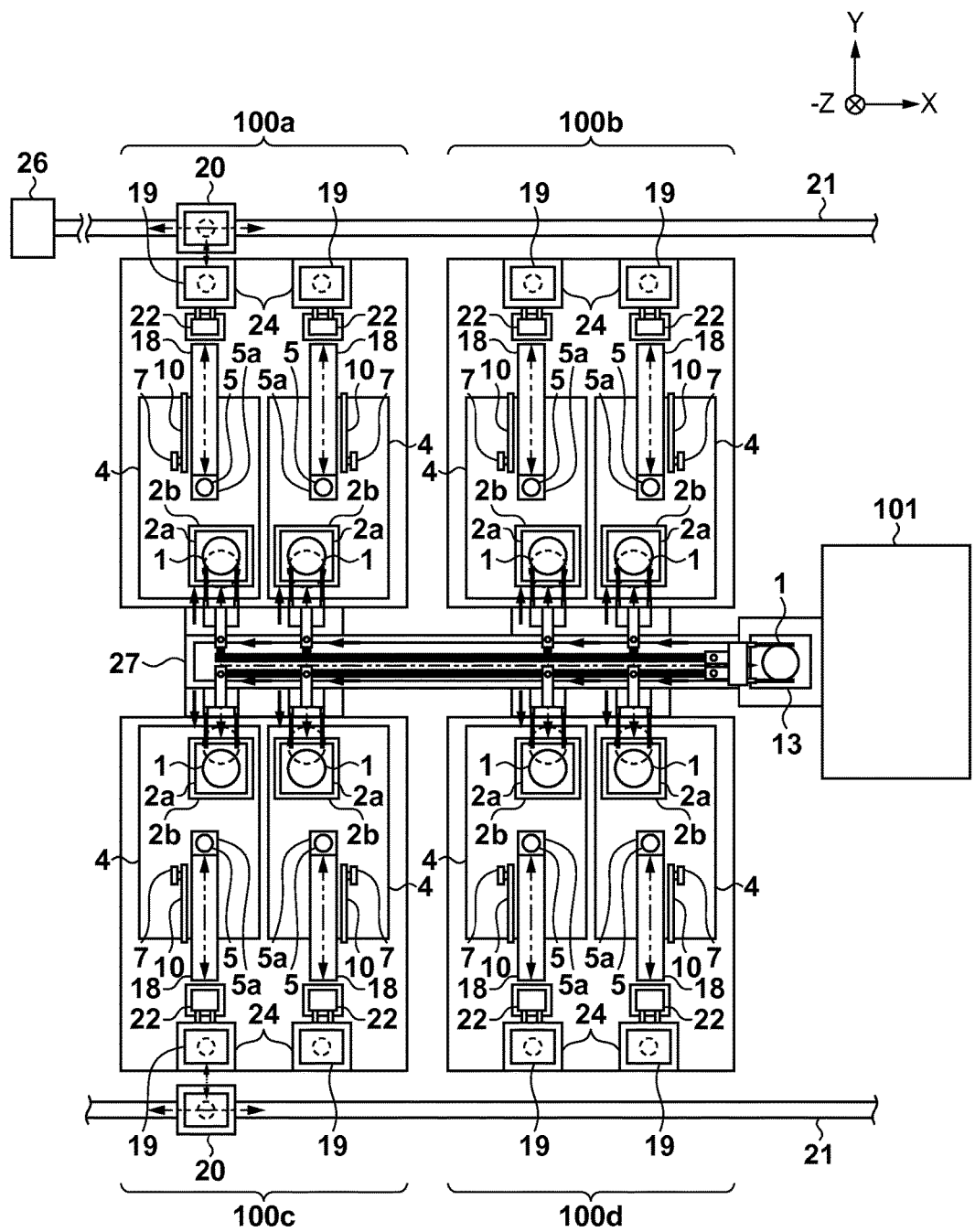

LITHOGRAPHY APPARATUS AND ARTICLE MANUFACTURING METHOD

BACKGROUND OF THE INVENTION

Field of the Invention

The present invention relates to a lithography apparatus and an article manufacturing method.

Description of the Related Art

As a technology for manufacturing a device such as a semiconductor device, there is known an imprint technology that forms a pattern of an imprint material on a substrate. Japanese Patent Laid-Open No. 2011-210992 describes a clustered imprint apparatus that is advantageous in terms of throughput because a plurality of imprint units perform imprint processes in parallel. The imprint apparatus of Japanese Patent Laid-Open No. 2011-210992 includes a conveying mechanism that conveys a substrate or an original to each imprint unit.

When performing an imprint process, a film of an adhesion material (adherence agent or adherence material) can be formed, by spin coating or the like, on the surface of a substrate to which the imprint material is supplied. Substrates of one lot with the film of the adhesion material can be conveyed to the clustered imprint apparatus. In the imprint apparatus, imprint processes for the plurality of substrates are performed in parallel.

In the imprint apparatus described in Japanese Patent Laid-Open No. 2011-210992, a plurality of imprint units are arranged in a row. In addition, a conveying mechanism is arranged along the row. If a plurality of imprint processes are performed in parallel in the imprint apparatus having the above arrangement, a plurality of substrates and a plurality of molds concerning the parallel process need to be conveyed efficiently from the viewpoint of throughput. Not only the imprint apparatus but also any other clustered lithography apparatuses using an original has the same problem.

SUMMARY OF THE INVENTION

The present invention provides, for example, a lithography apparatus advantageous in terms of throughput.

The present invention in its first aspect provides a lithography apparatus comprising an original conveying path, a substrate conveying path, and a plurality of patterning devices each configured to perform patterning on a substrate using an original, wherein the plurality of patterning devices are arranged in two rows, the substrate conveying path is provided between and along the two rows, and the original conveying path is provided in each of two rows between and along the two rows of the patterning devices are arranged.

The present invention in its second aspect provides a method of manufacturing an article comprising: performing patterning on a substrate using a lithography apparatus according to the first aspect; and processing the substrate that has undergone the patterning to manufacture the article.

Further features of the present invention will become apparent from the following description of exemplary embodiments with reference to the attached drawings.

BRIEF DESCRIPTION OF THE DRAWINGS

FIG. 11 is a view for explaining conveyance of substrates;

FIGS. 14A and 14B are views for explaining conveyance of substrates;

FIGS. 16A to 16D are views for explaining conveyance of substrates;

FIGS. 20A and 20B are views for explaining loading of substrates;

FIG. 21 is a view for explaining loading of substrates;

DESCRIPTION OF THE EMBODIMENTS

[First Embodiment]

Figure 1:
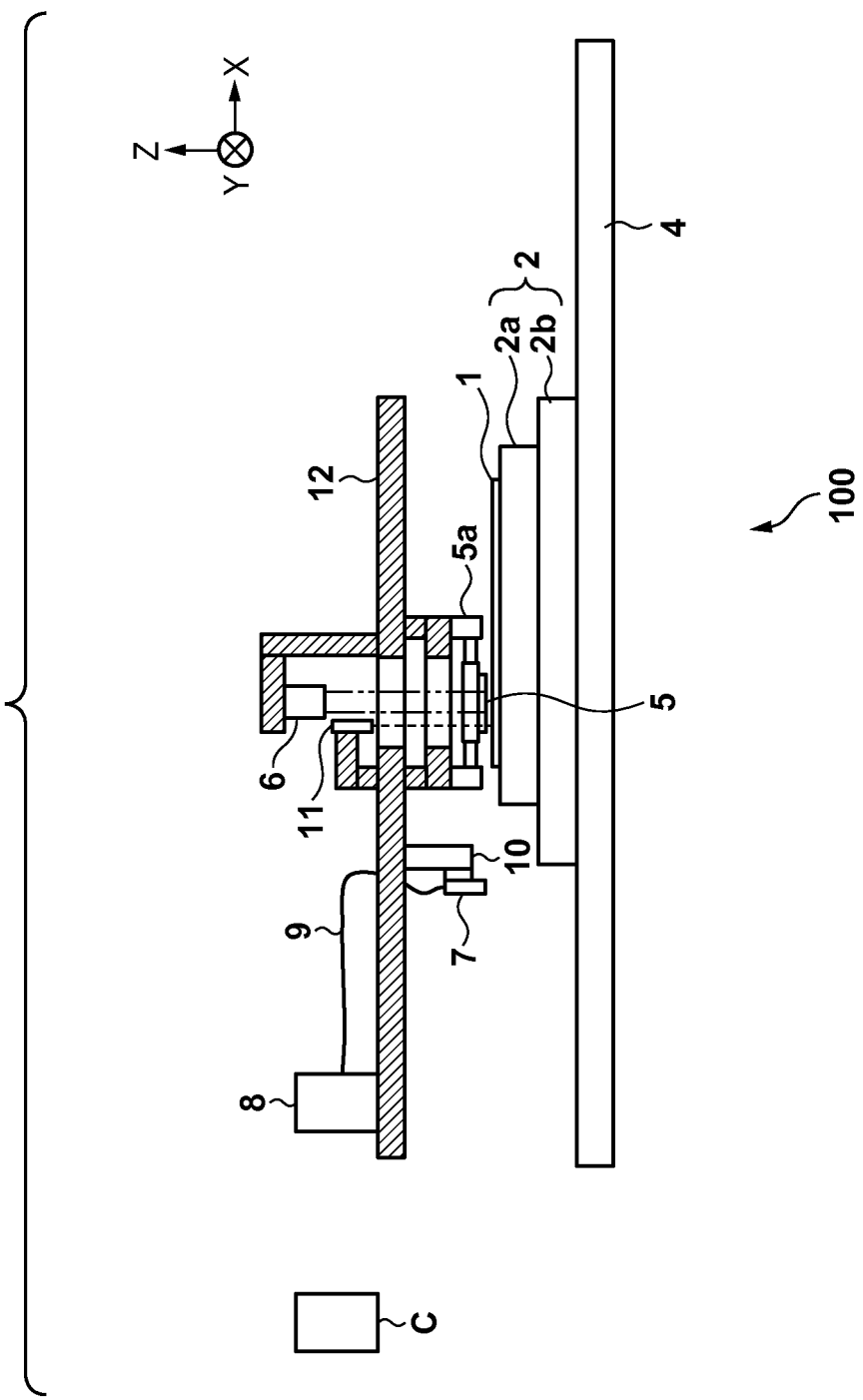
FIG. 1 is a view showing the arrangement of an imprint unit.

An imprint apparatus used as a lithography apparatus in the present invention will be described with reference to FIGS. 1 and 2. An example will be described here in which a UV light-curing type imprint apparatus that cures a resin (also called an imprint material or resist) by irradiation of ultraviolet light (UV light) is used. However, the present invention is also applicable to an imprint apparatus that cures a resin by irradiation of light in another wavelength range or an imprint apparatus that cures a resin by another energy (for example, heat). In addition, the present invention can be generalized to a clustered lithography apparatus such as an exposure apparatus, which performs a lithography process of forming a pattern on a resist coating a substrate.

An imprint unit (patterning device) 100 according to this embodiment performs patterning using an original (mold) for a plurality of shot regions of a substrate (wafer) by repeating an imprint process. In one imprint process, the original is pressed against the resin (imprint material), and the resin is cured in this state, thereby forming a pattern in one shot region of the substrate.

The pattern of an original 5 is transferred to a substrate 1, thereby forming an element pattern corresponding to the pattern of the original 5 on the surface layer (patterning layer) of the substrate 1. A substrate stage 2 holds the substrate 1 and moves it in directions perpendicular to each other. The substrate stage 2 includes a fine moving stage 2a that holds the substrate, and a coarse moving stage 2b that supports the fine moving stage 2a. A base frame 4 holds and positions the substrate stage 2. A three-dimensional pattern is formed on the surface of the original 5. When the resin (resist) on the substrate 1 contacts the original 5, the pattern of the original 5 is transferred to the resin on the substrate 1. An original stage 5a performs an operation of driving the original in the vertical direction and bringing the original 5 into contact with the resin on the substrate 1.

A UV light generation unit (UV light source) 6 irradiates the resin with UV light 6a via the original 5 to cure the resin. The UV light generation unit 6 includes, for example, a light source such as a halogen lamp that generates i-line or g-line, and an optical system that collects and shapes the light generated by the light source. A dispenser 7 dispenses the resin as small droplets, thereby coating the surface of the substrate 1 with a predetermined amount of resin. A tank 8 stores an uncured resin and supplies it to the dispenser 7 via a pipe 9.

Figure 2:
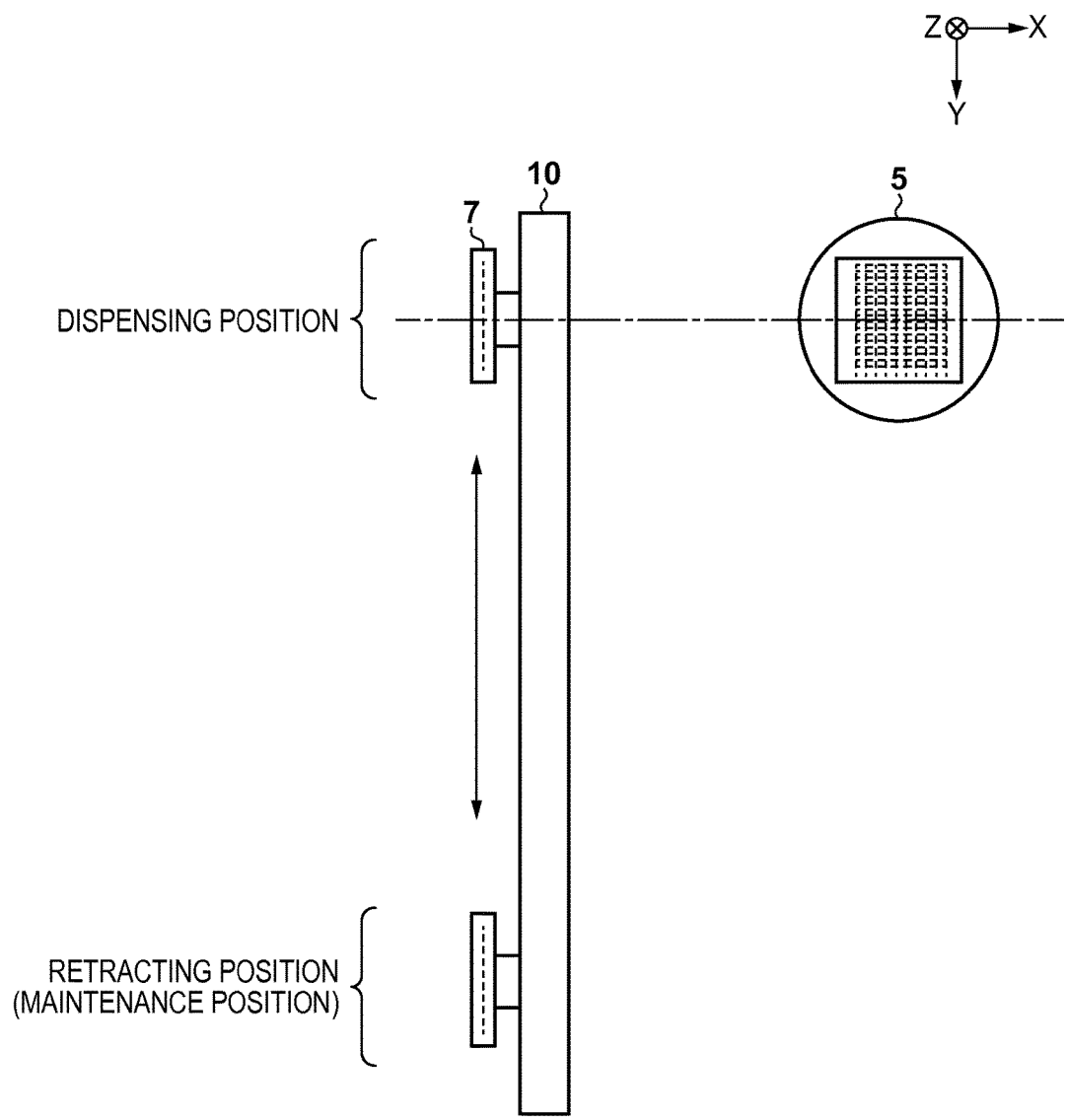
FIG. 2 is a view for explaining the arrangement of a dispenser.

A moving mechanism 10 moves the dispenser 7 between a dispensing position and a retracting position (maintenance position), as shown in FIG. 2. In a normal dispensing operation, the dispenser 7 is positioned to the dispensing position. When performing maintenance, the dispenser 7 is moved to the retracting position (maintenance position) to clean or exchange it. An alignment scope 11 is a microscope that aligns the pattern positions on the original 5 and the substrate 1 after the dispenser 7 supplies (dispenses or applies) the resin onto the substrate 1. The alignment scope 11 measures overlay between an alignment mark provided on the original 5 and an alignment mark on the substrate 1, thereby aligning the original 5 and the substrate 1 with each other. A base 12 supports and fixes the dispenser 7, the UV light generation unit 6, and the like. The units of the imprint apparatus are controlled by a control unit C.

Figure 3:
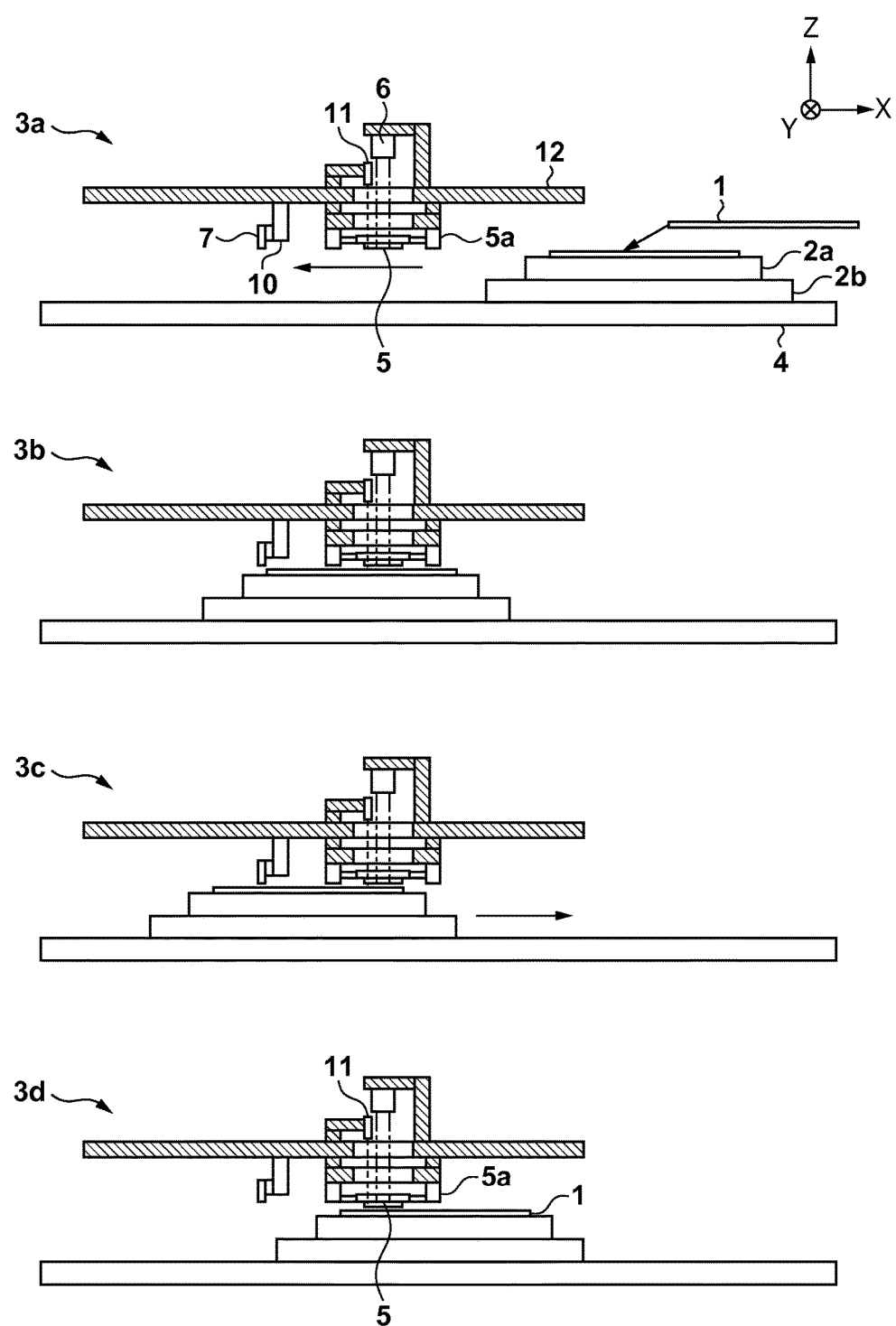
FIG. 3 shows views for explaining the sequence of an imprint process.

The sequence of an imprint process will be described with reference to FIGS. 3 and 4. In step 3a, the substrate 1 is placed on the substrate stage 2. In step 3b, the substrate stage 2 starts moving the substrate 1 to the point under the dispenser 7 that dispenses the resin. In step 3c, the dispenser 7 coats the surface of the substrate 1 with a predetermined amount of resin. In step 3d, the original stage 5a moves the original 5 downward. In a state in which the original 5 contacts the resin on the substrate 1, the alignment scope 11 overlays the alignment mark on the original side and that on the substrate side, thereby adjusting their relative positions.

Figure 4:
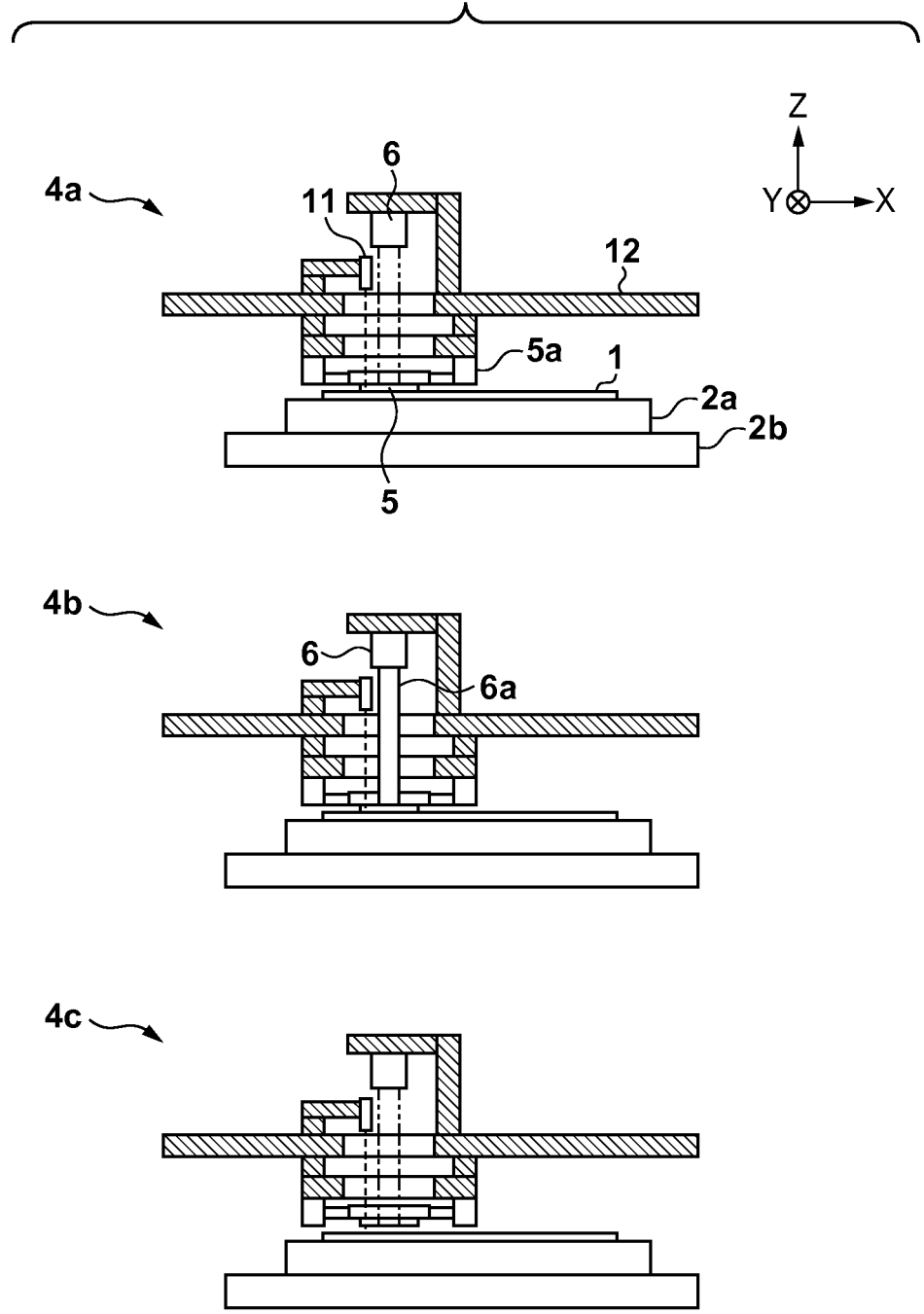
FIG. 4 shows views for explaining the sequence of an imprint process.
Figure 5:
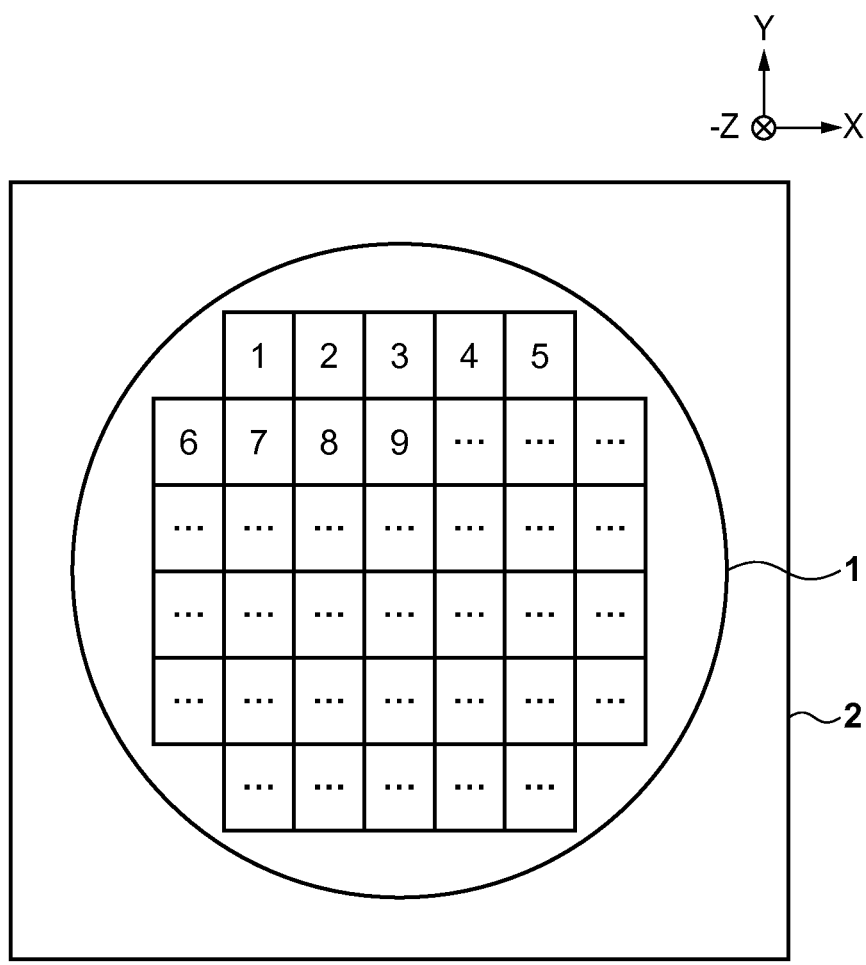
FIG. 5 is a view for explaining shot regions.

In step e shown in FIG. 4, the original stage 5a moves the original 5 down toward the substrate 1 and presses the original 5 against the resin on the substrate 1, thereby transferring the pattern. In step f, the UV light generation unit 6 emits the UV light 6a from above and irradiates the resin with the UV light 6a via the original 5. The uncured resin is cured at this time. In step g, when the original 5 is removed and retracted upward, the patterned resin layer is formed on the substrate 1, and the imprint process ends. Steps 3a to 4g described above are performed, thereby repeating the imprint process for a plurality of shot regions formed on the substrate 1 in the order of shot numbers 1, 2, 3, . . . , as shown in FIG. 5.

Figure 6:
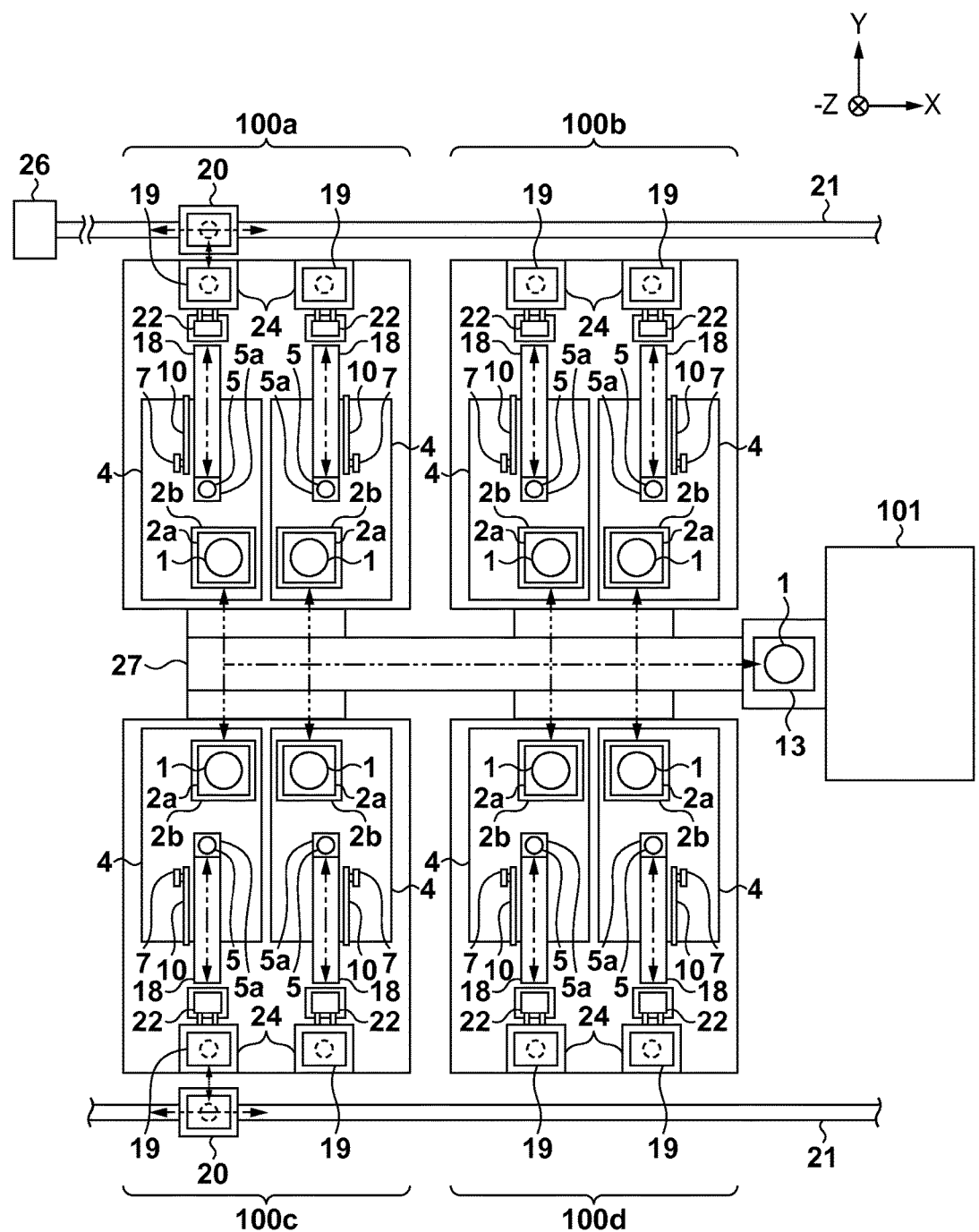
FIG. 6 is a view for explaining a clustered imprint apparatus.

Details of a clustered imprint apparatus including a plurality of imprint units according to this embodiment will be described next with reference to FIGS. 6 to 24. The clustered imprint apparatus is a system in which a plurality of imprint units are adjacently arranged in order to ensure productivity and save the space, and the imprint units simultaneously manufacture an article such as a device. In the clustered imprint apparatus according to this embodiment, imprint processes are simultaneously performed for a plurality of substrates 1 of one lot using four imprint units 100a to 100d, as shown in FIG. 6.

Figure 7A:
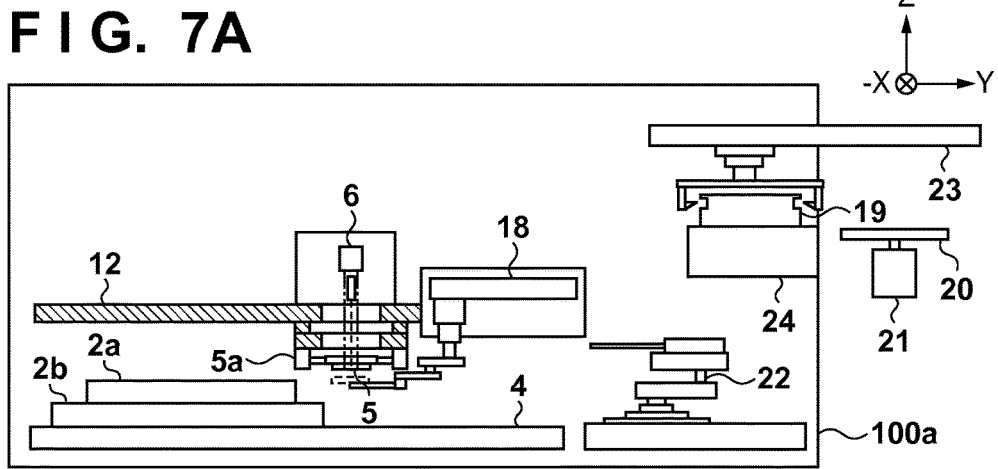
FIGS. 7A to 7C are views for explaining conveyance of an original.
Figure 7B:
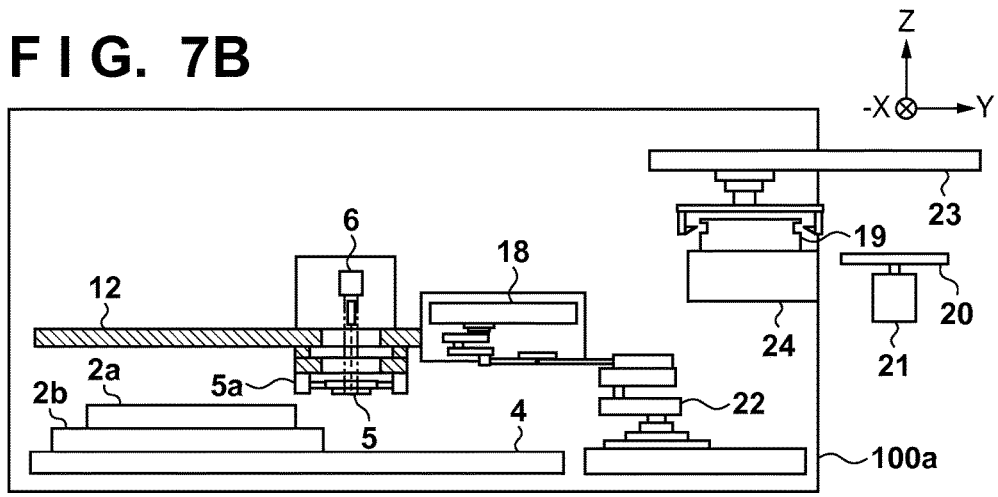
Figure 7C:
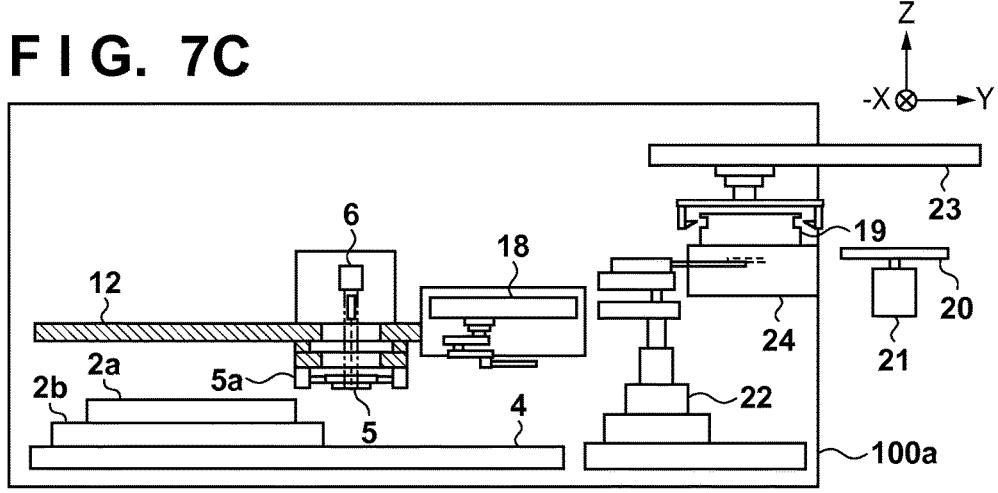

In this embodiment, each of the imprint units 100, for example, the imprint unit 100a includes two substrate stages 2 for moving the substrate 1 and two original stages 5a for driving the original 5 in the vertical direction. Each imprint unit 100 also includes two dispensers 7 and two moving mechanisms 10 for them. In this embodiment, each imprint unit 100 is configured to include two substrate stages 2 and two original stages 5a from the viewpoint of space saving. However, each imprint unit 100 may be configured to include one substrate stage 2 and one original stage 5a. A conveying hand 18 detaches the original 5 for the original stage 5a, as shown in FIG. 7A, and transfers it to another conveying hand 22, as shown in FIG. 7B. The conveying hand 22 conveys the original 5 into an original case 19 located in a fixed table 24, as shown in FIG. 7C.

Figure 8A:
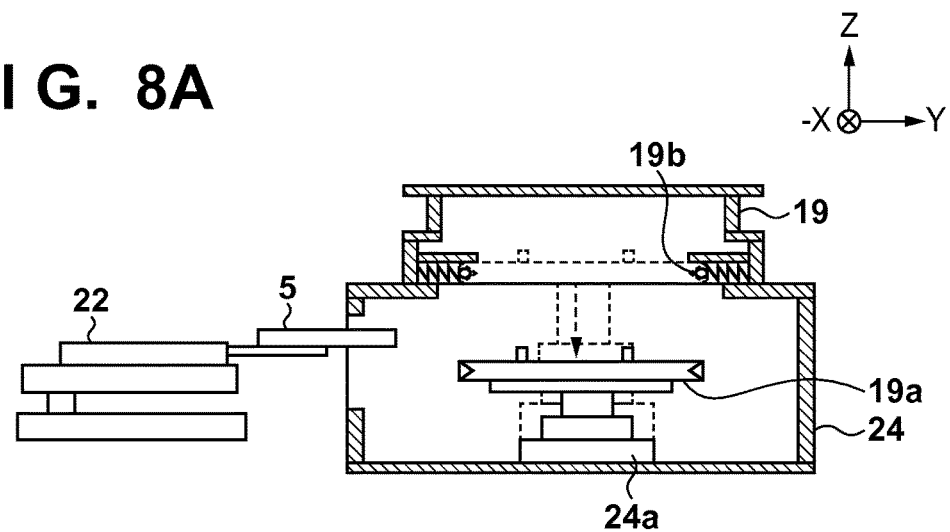
FIGS. 8A to 8C are views for explaining conveyance of an original.
Figure 8B:
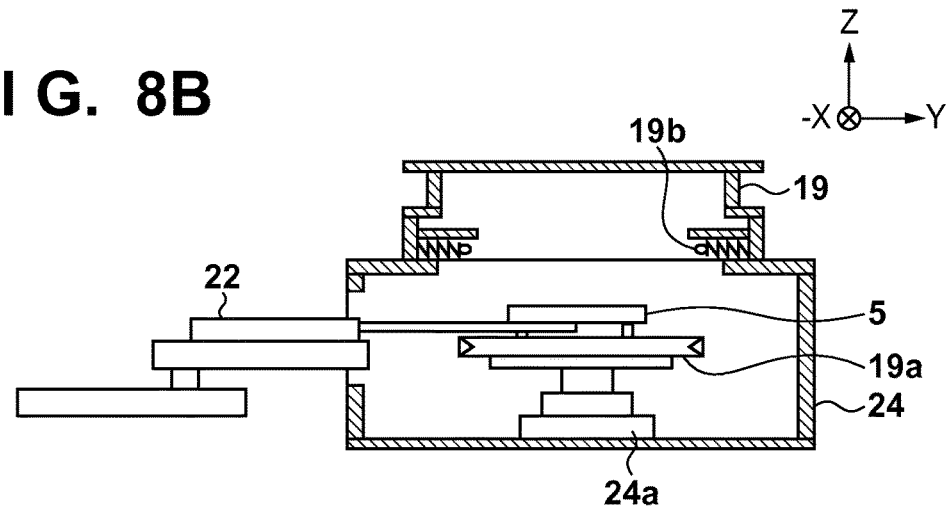
Figure 8C:
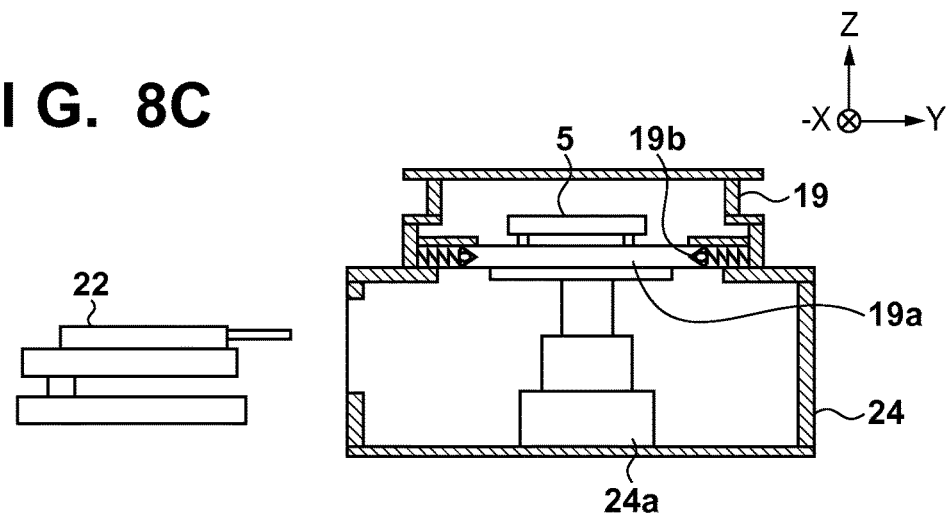

As shown in FIG. 8A, a detachable lid 19a is provided at the lower portion of the original case 19. The lid 19a can freely be detached from the original case main body by a lock mechanism 19b. The lid 19a waits in a state in which it is moved in the direction of an arrow shown in FIG. 8A by an elevating mechanism 24a provided in the fixed table 24. Next, the conveying hand 22 attaches the original 5 to the lid 19a arranged on the elevating mechanism 24a, as shown in FIG. 8B. Then, the original 5 that is attached to the lid 19a is moved to the side of the main body of the original case 19 by the elevating mechanism 24a, as shown in FIG. 8C. The lid 19a is locked by the lock mechanism 19b, thus completing conveyance of the original 5 to the original case 19.

Figure 9A:
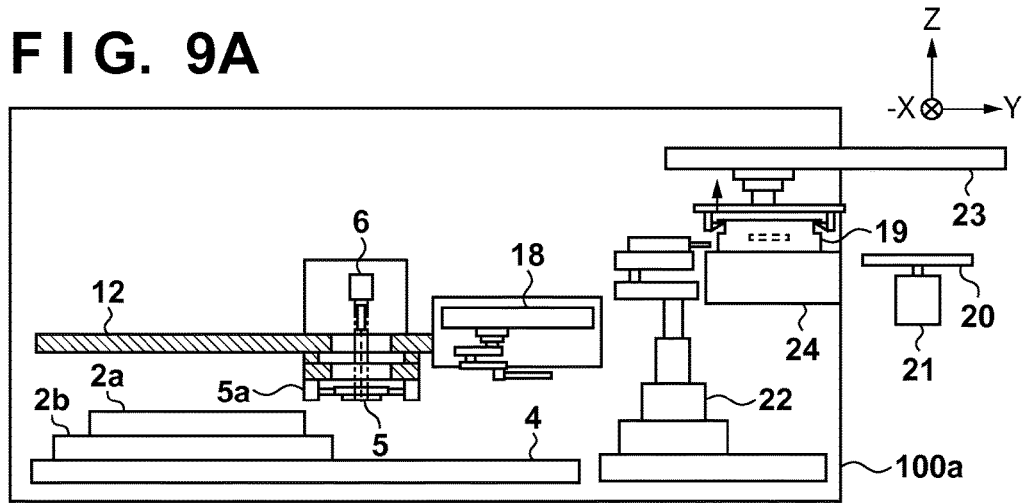
FIGS. 9A to 9C are views for explaining conveyance of an original.
Figure 9B:
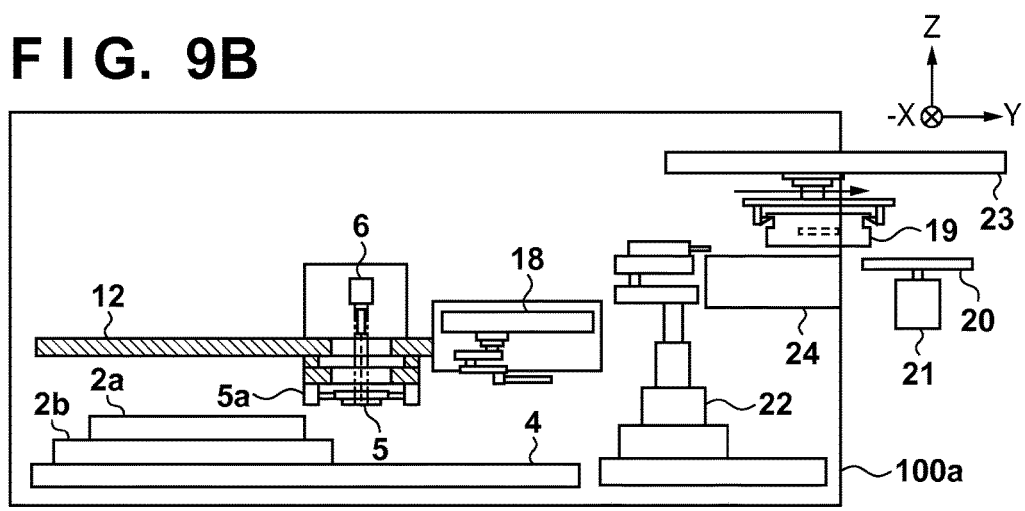
Figure 9C:
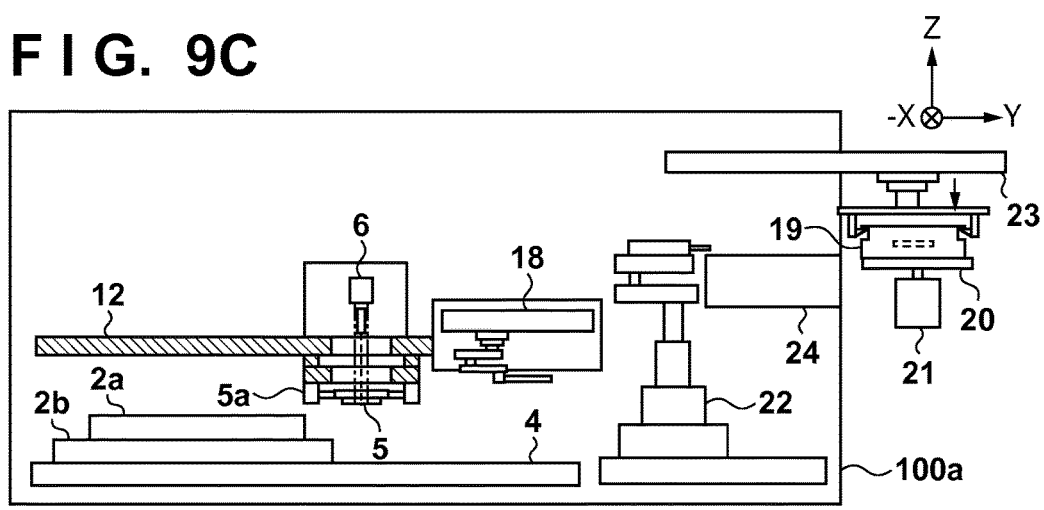

An arrangement for conveying the original 5 stored in the original case 19 to an original conveying path 21 provided outside the imprint unit 100 will be described next with reference to FIGS. 9A to 9C. As shown in FIGS. 9A and 9B, the original case 19 is picked up by a conveying mechanism 23 and transferred to a moveable table 20 that is provided on the original conveying path 21 and can move while holding the original case 19. As shown in FIG. 9C, the original case 19 is placed on the moveable table 20 by the conveying mechanism 23. The conveying hands 18 and 22, the original case 19, the conveying mechanism 23, and the moveable table constitute an original conveying unit 25 that conveys the original 5 from an original stocker (original storage) 26 to the original stage 5a.

As shown in FIG. 6, the original case 19 placed on the moveable table 20 is conveyed via the original conveying path 21 common to the plurality of imprint units 100. The original cases 19 and the originals 5 are stored in the original stocker 26 in the production plant. The original cases 19 and the originals 5 can also be exchanged and conveyed between the plurality of imprint units 100a to 100d. In addition, an imprint process using a specific original 5 can be performed by a specific imprint unit 100.

Figure 10:
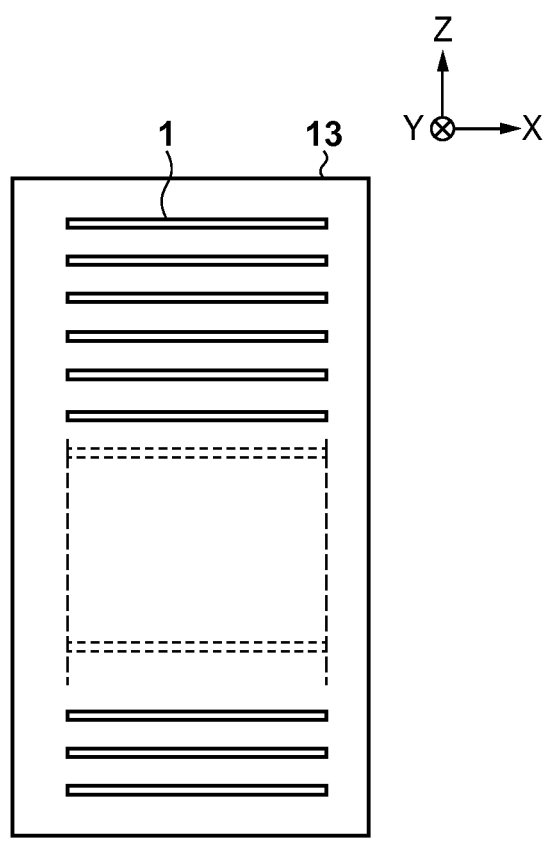
FIG. 10 is a view for explaining a substrate stocker (substrate storage)

The originals 5, the original stages 5a, the UV light generation units 6, the dispensers 7, the moving mechanisms 10, and the alignment scopes 11, which are provided by two in each imprint unit, as shown in FIG. 6, are commonly supported and fixed by the base 12 shown in FIG. 6. With the above arrangement, before resist coating for the imprint process in the imprint units 100a to 100d, an adhesion material is applied to the overall surface of the substrate 1 on the resist coating side by spin coating to improve the adhesion between the resist and the substrate 1 and resist spreadability on the upper surface of the substrate 1. The adhesion material contains a photoreactive monomolecular film or a reactive functional group, and is applied to the whole upper surface of the substrate 1 by spin coating by a coating mechanism in a coating device 101. When performing spin coating, the adhesion material is applied to the substrates 1 of one lot at once. The time from the adhesion material spin coating to resist dispensing needs to be set to a predetermined time. For this purpose, after the plurality of substrates 1 have undergone spin coating of the adhesion material at once, the substrates 1 of one lot with the coats of the adhesion material are stored in a substrate stocker 13, as shown in FIG. 10.

Figure 12A:
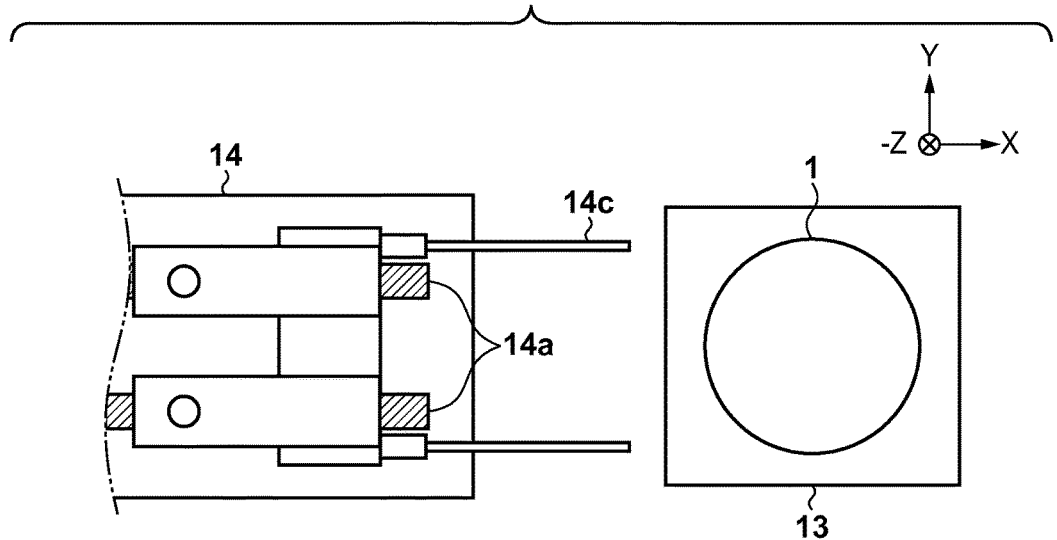
FIGS. 12A and 12B are views for explaining conveyance of substrates.
Figure 12B:
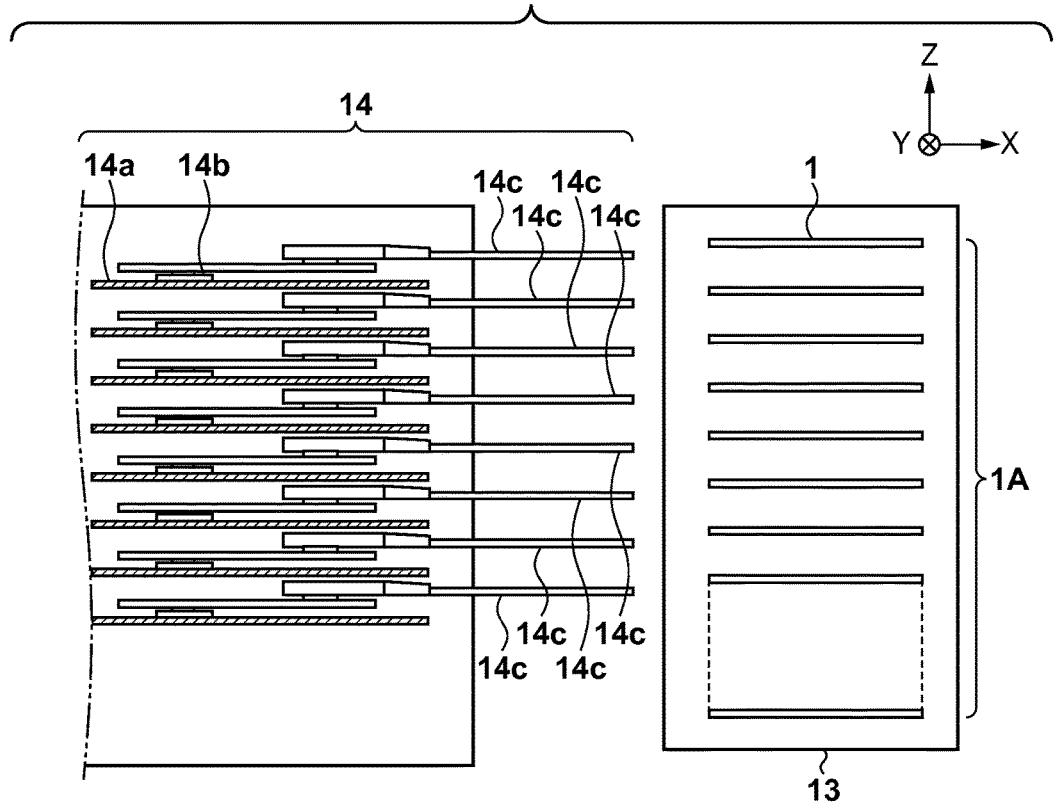

FIGS. 11 to 23 show a detailed arrangement for conveying the substrates 1 stored in the substrate stocker 13, via a substrate conveying path, to the plurality of imprint units 100a to 100d included in the clustered imprint apparatus. As shown in FIGS. 11, 12A, and 12B, a substrate conveying unit 14 is provided with hand members 14c that convey the substrates 1. Each hand member 14c conveys the substrates 1 to the imprint units 100a to 100d. As shown in FIG. 12A, the substrate conveying unit 14 includes the hand members 14c, guide members 14a, and movable portions (movable elements) 14b. The movable portion 14b moves the hand member 14c holding the substrate 1 to each imprint unit 100 via the guide member 14a. As shown in FIG. 12B, the substrate conveying unit 14 includes eight hand members 14c to simultaneously convey the substrates 1 to the imprint units 100a to 100d.

Figure 13A:
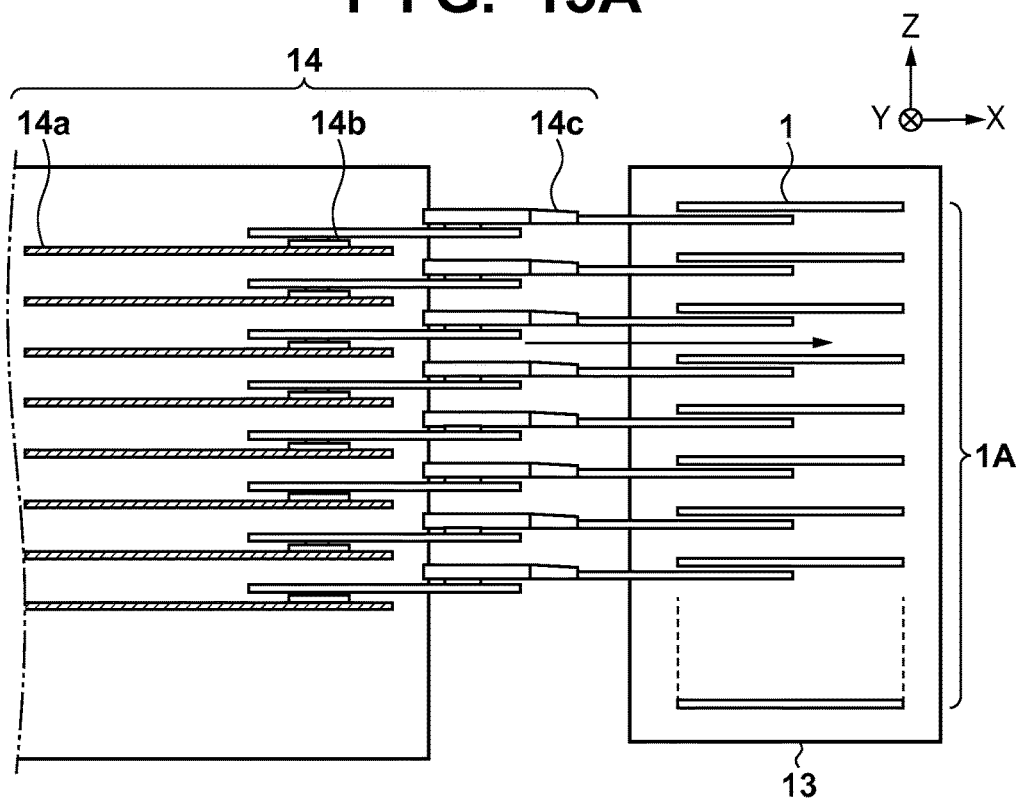
FIGS. 13A and 13B are views for explaining conveyance of substrates.
Figure 13B:
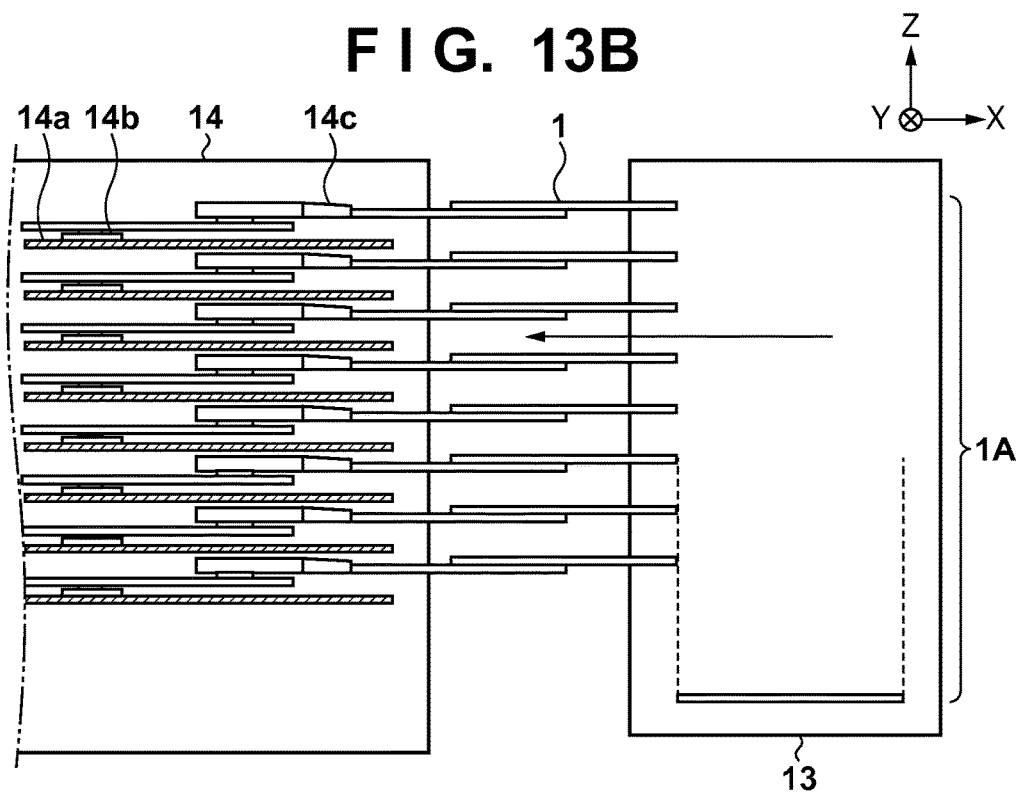

As shown in FIG. 13A, all the hand members 14c move in the direction of an arrow and hold the substrates 1 in the substrate stocker 13. Next, the hand members 14c move in the direction of an arrow shown in FIG. 13B and extract the held substrates 1 from the substrate stocker 13. FIGS. 14A to 20B show a detailed arrangement for implementing the conveyance method of the hand members 14c. FIGS. 14A and 14B show the conveying operation of four hand members 14c. The four hand members 14c convey the substrates 1 to the imprint units 100a and 100b located on one side of the substrate conveying unit 14. There is provided a driving mechanism that is moved in the direction of an arrow in FIG. 14A by the substrate conveying unit 14 and can orthogonally rotate in the direction of an arrow in FIG. 14A when loading the substrate 1 into the imprint units 100a and 100b. The substrates 1 are conveyed two by two to each of the imprint units 100a and 100b.

Figure 15A:
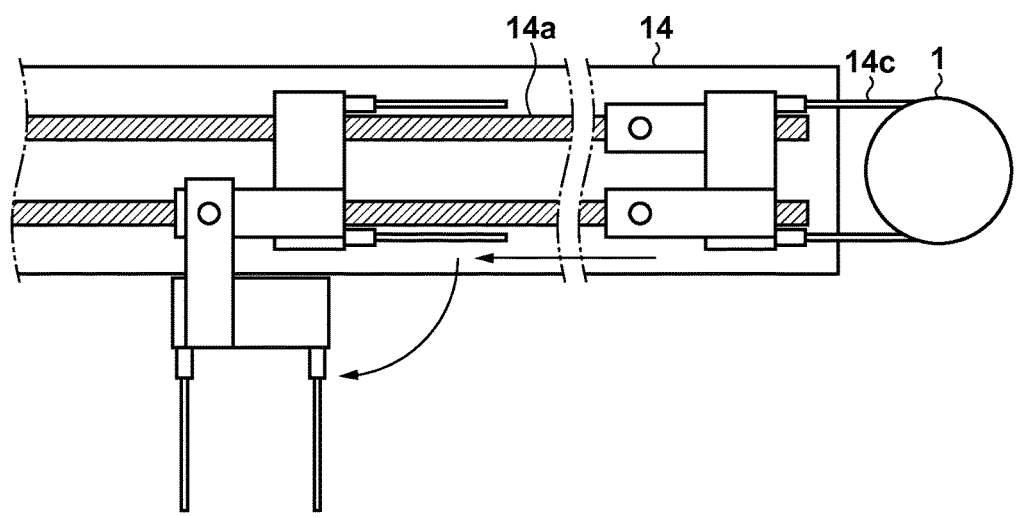
FIGS. 15A and 15B are views for explaining conveyance of substrates.
Figure 15B:
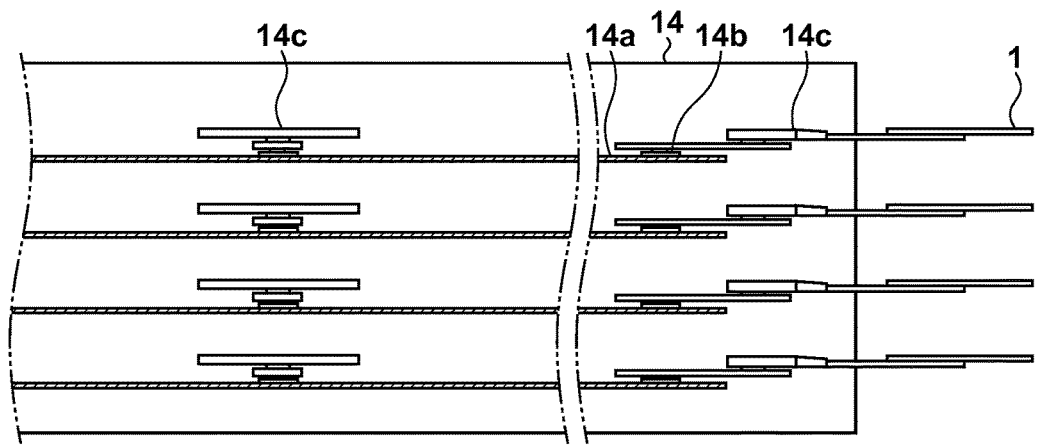

FIGS. 15A and 15B show the conveying operation of the remaining four hand members 14c. The four hand members 14c convey the substrates 1 to the imprint units 100c and 100d on the other side of the substrate conveying unit 14 opposite to FIGS. 14A and 14B. There is provided a driving mechanism that is moved in the direction of an arrow in FIG. 15A by the substrate conveying unit 14 and can orthogonally rotate in the direction of an arrow in FIG. 15A when loading the substrate 1 into the imprint units 100c and 100d. The substrates 1 are conveyed two by two to each of the imprint units 100c and 100d.

FIGS. 16A to 16D show the detailed structure of the substrate conveying unit 14. As shown in FIGS. 16A and 16B, the guide members 14a and the movable portions 14b are provided, and a permanent magnet (stator) 14d is arranged in the moving direction on each guide member 14a. In general, a coil is formed in the movable portion 14b. The movable portion 14b is generally formed from a coil, and generates a driving force in the directions of arrows shown in FIG. 16C by the interaction (for example, Lorentz force) between a current excited in the coil and a magnetic flux generated by a magnetic circuit formed by the permanent magnet 14d, thereby moving in the direction of the arrows in FIG. 16C. The movable portion (movable element) 14b and the permanent magnet (stator) 14d constitute the driving mechanism for driving the hand member 14c. FIG. 16C is an enlarged view of a portion in FIG. 16A, and FIG. 16D is an enlarged view of a portion in FIG. 16B.

Figure 17A:
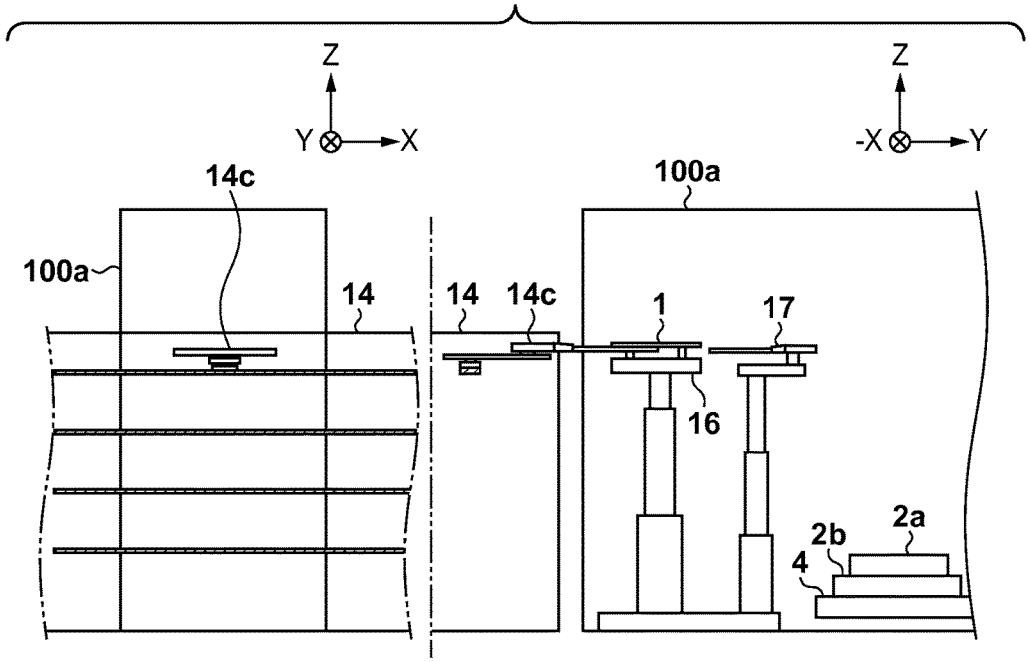
FIGS. 17A and 17B are views for explaining conveyance of substrates.
Figure 17B:
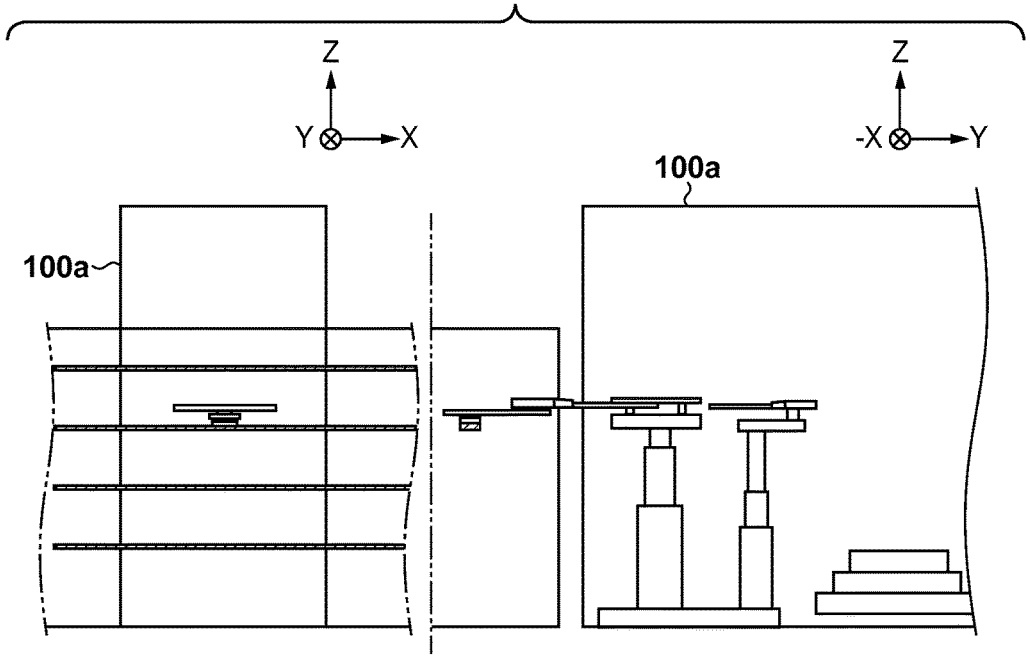
Figure 18A:
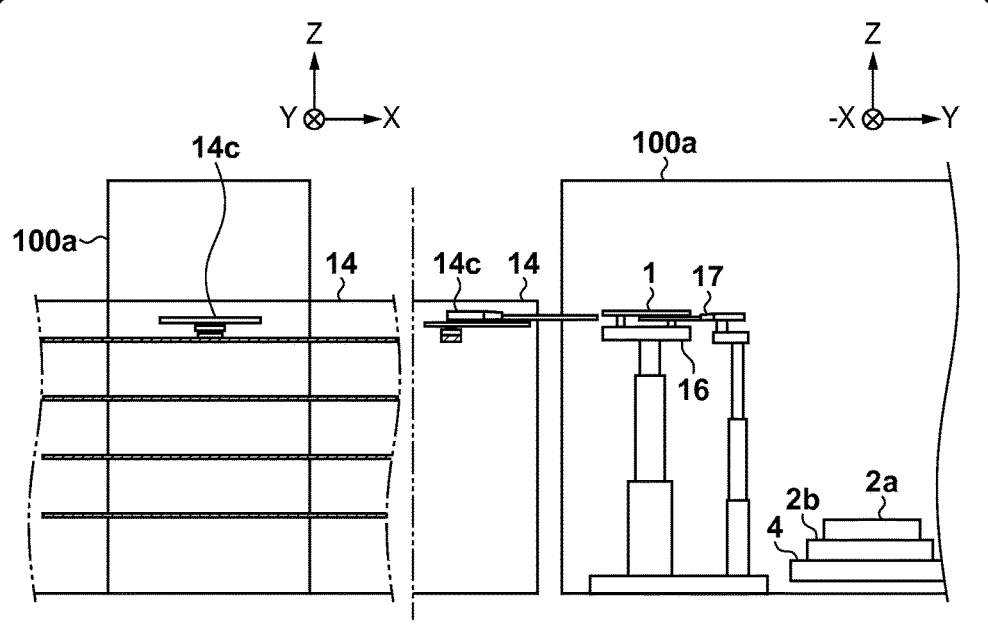
FIGS. 18A and 18B are views for explaining conveyance of substrates.
Figure 18B:
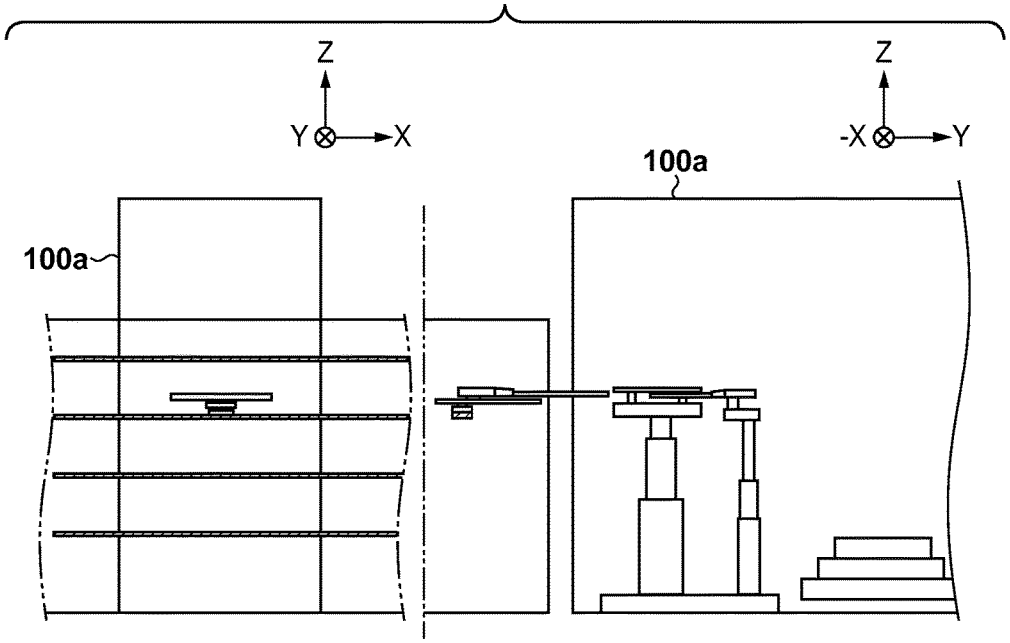
Figure 19A:
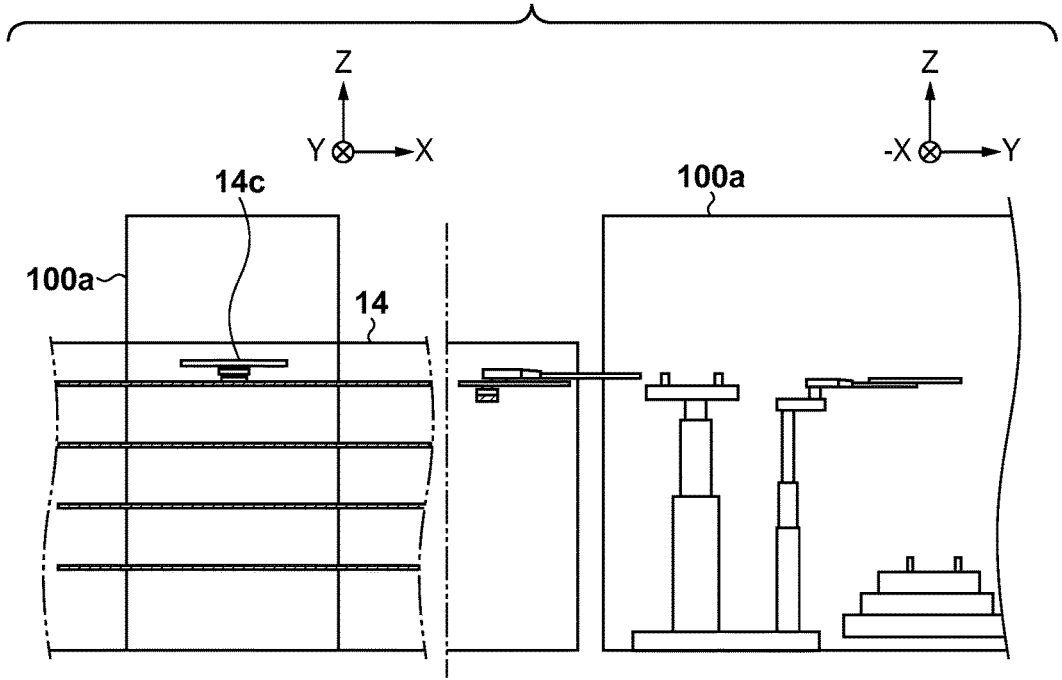
FIGS. 19A and 19B are views for explaining conveyance of substrates.
Figure 19B:
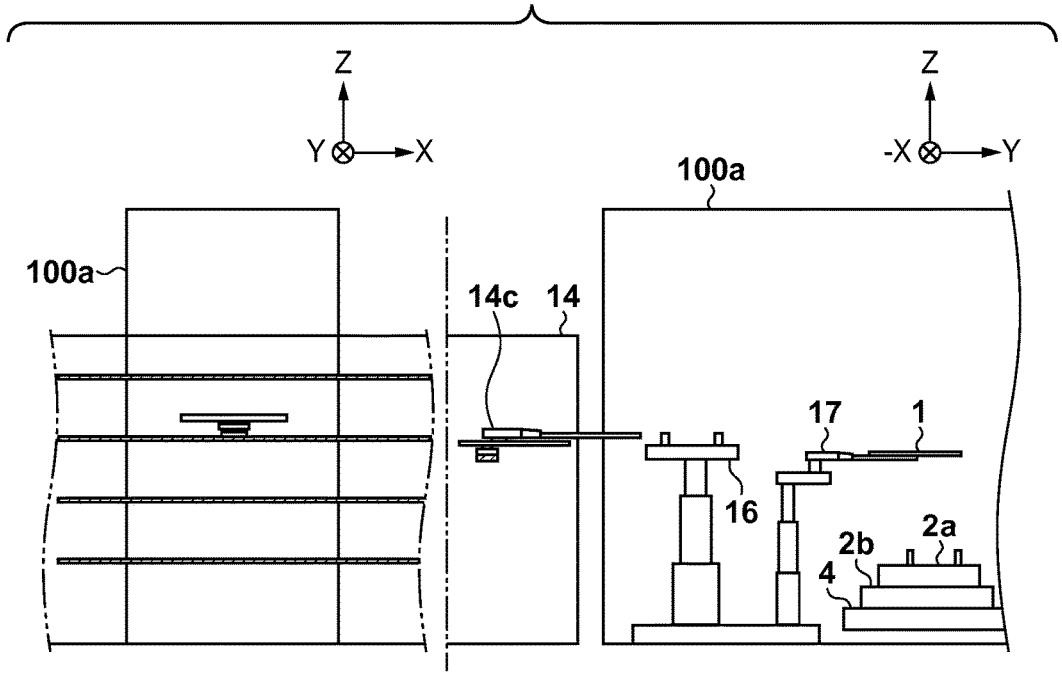

FIGS. 17A to 20B show loading/unloading of the substrates 1 to/from each imprint unit 100 by the actual substrate conveying unit 14 having the above-described structure. FIGS. 17A and 17B show an arrangement for implementing conveyance of two substrates 1 to one imprint unit 100a. Referring to FIGS. 17A to 20B, when conveying the substrate 1 to the imprint unit 100a, the hand member 14c provided in the substrate conveying unit 14 temporarily conveys the substrate 1 to a substrate transferring unit (substrate transferring portion) 16 provided in the imprint unit 100a, as shown in FIGS. 17A and 17B.

Next, as shown in FIGS. 17A to 18B, the substrate conveying unit 14 transfers the substrate 1 at a position where the conveyance height in the height direction in the apparatus is variably set in correspondence with a plurality of imprint positions of the imprint unit 100a. To do this, the height of each of the substrate transferring units 16 and 17 is set in accordance with the height of the hand member 14c. As shown in FIGS. 18A to 19B, the substrate 1 temporarily placed on the substrate transferring unit 16 is newly held by another substrate transferring unit 17, and conveyance to the fine moving stage 2a starts. As shown in FIGS. 20A and 20B, the substrate transferring unit 17 transfers the substrate 1 to the fine moving stage 2a, and the imprint operation starts. The above-described conveying operation is similarly executed for the imprint units 100b to 100d other than the imprint unit 100a (not shown).

Figure 22:
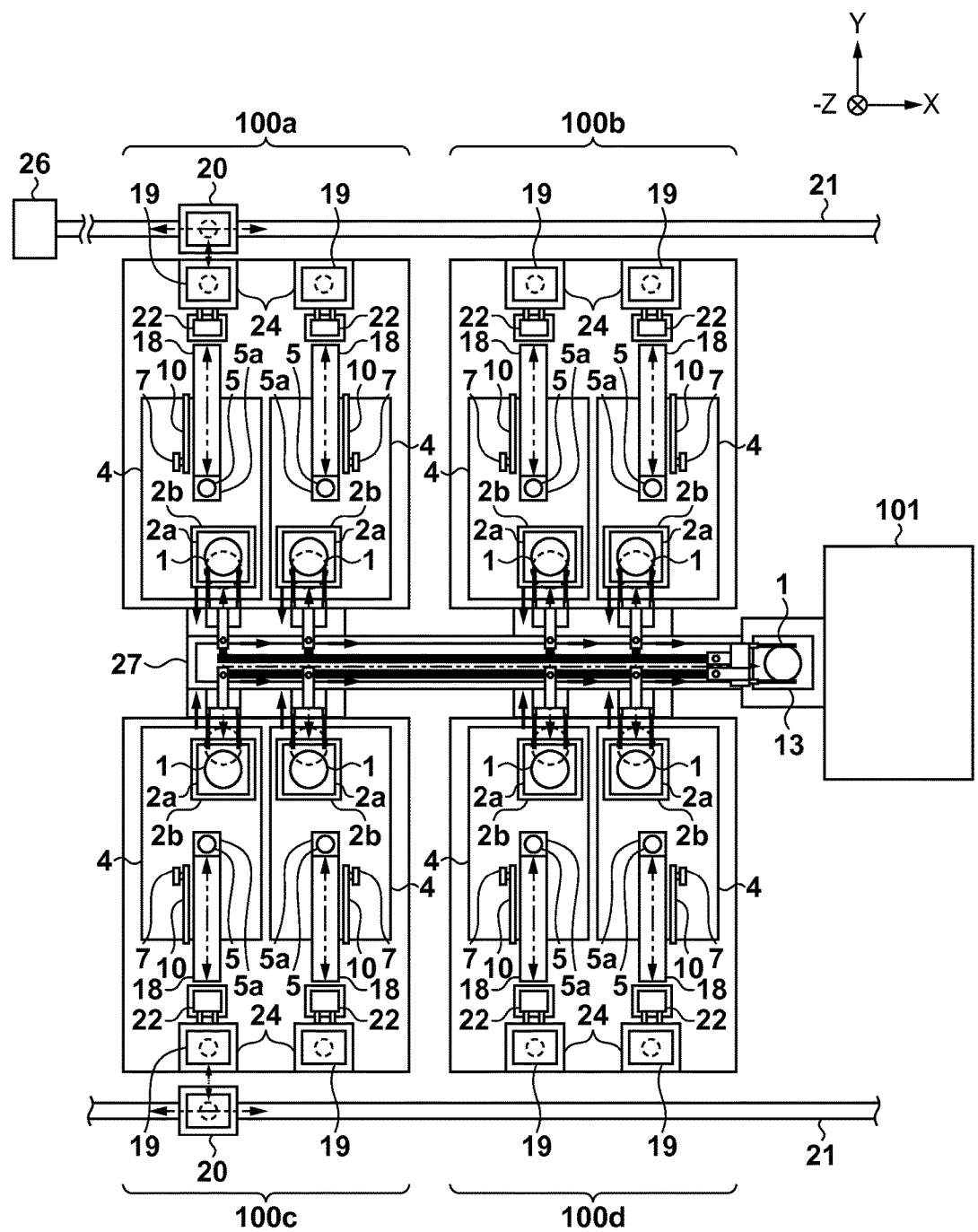
FIG. 22 is a view for explaining unloading of substrates.
Figure 23:
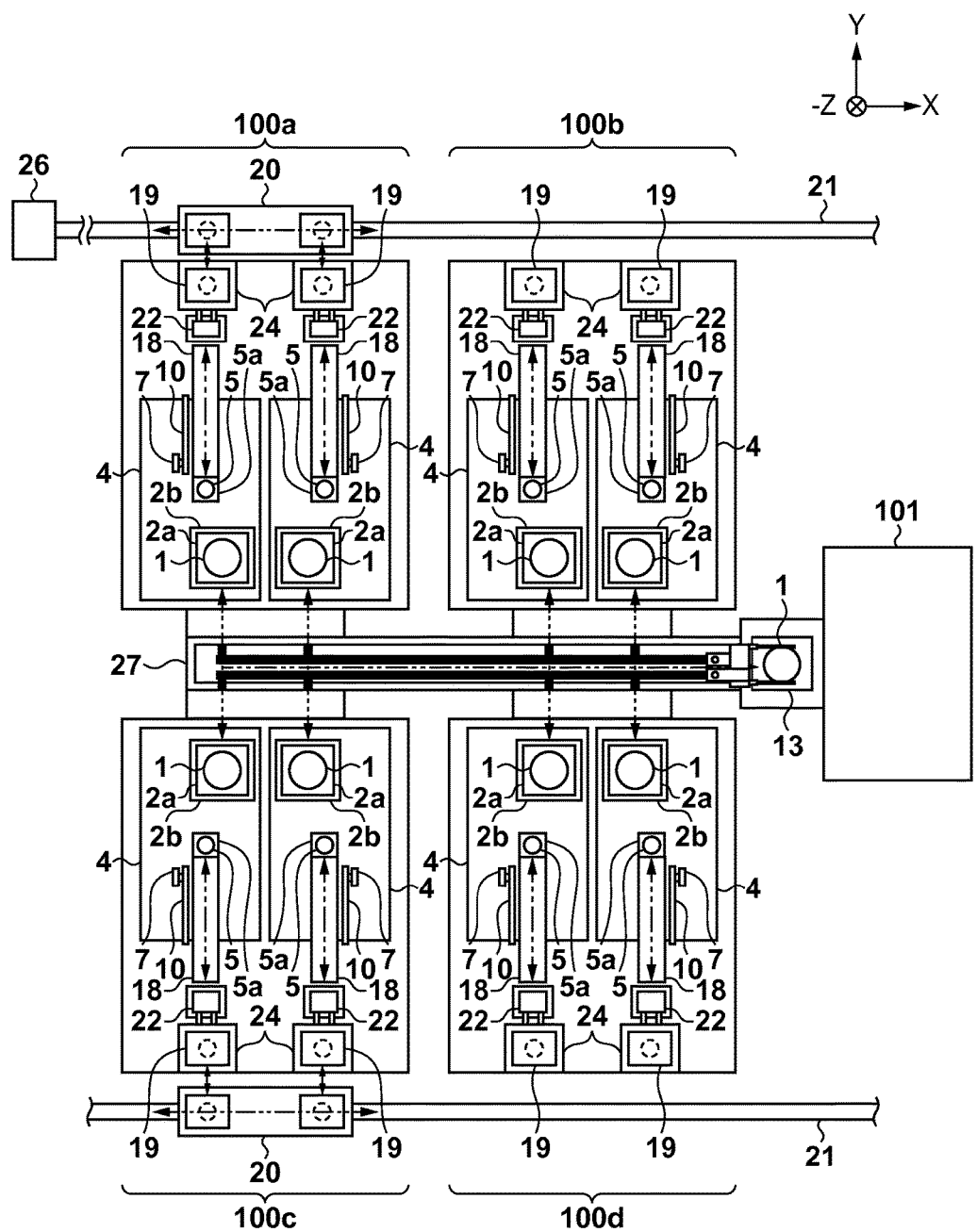
FIG. 23 is a view for explaining conveyance of substrates.

As shown in FIG. 21, the hand members 14c almost simultaneously convey two substrates 1 to a plurality of imprint positions provided in each of the imprint units 100a to 100d via moving paths indicated by arrows in FIG. 21. After the imprint process ends for the substrates 1 conveyed to the imprint units 100a to 100d, the substrates 1 are unloaded two by two from each of the imprint units 100a to 100d, as shown in FIG. 22. Here, as shown in FIG. 23, the hand members 14c hold the substrates 1 and almost simultaneously unload two substrates 1 from each of the imprint units 100a to 100d via moving paths indicated by arrows in FIG. 23.

Figure 24:
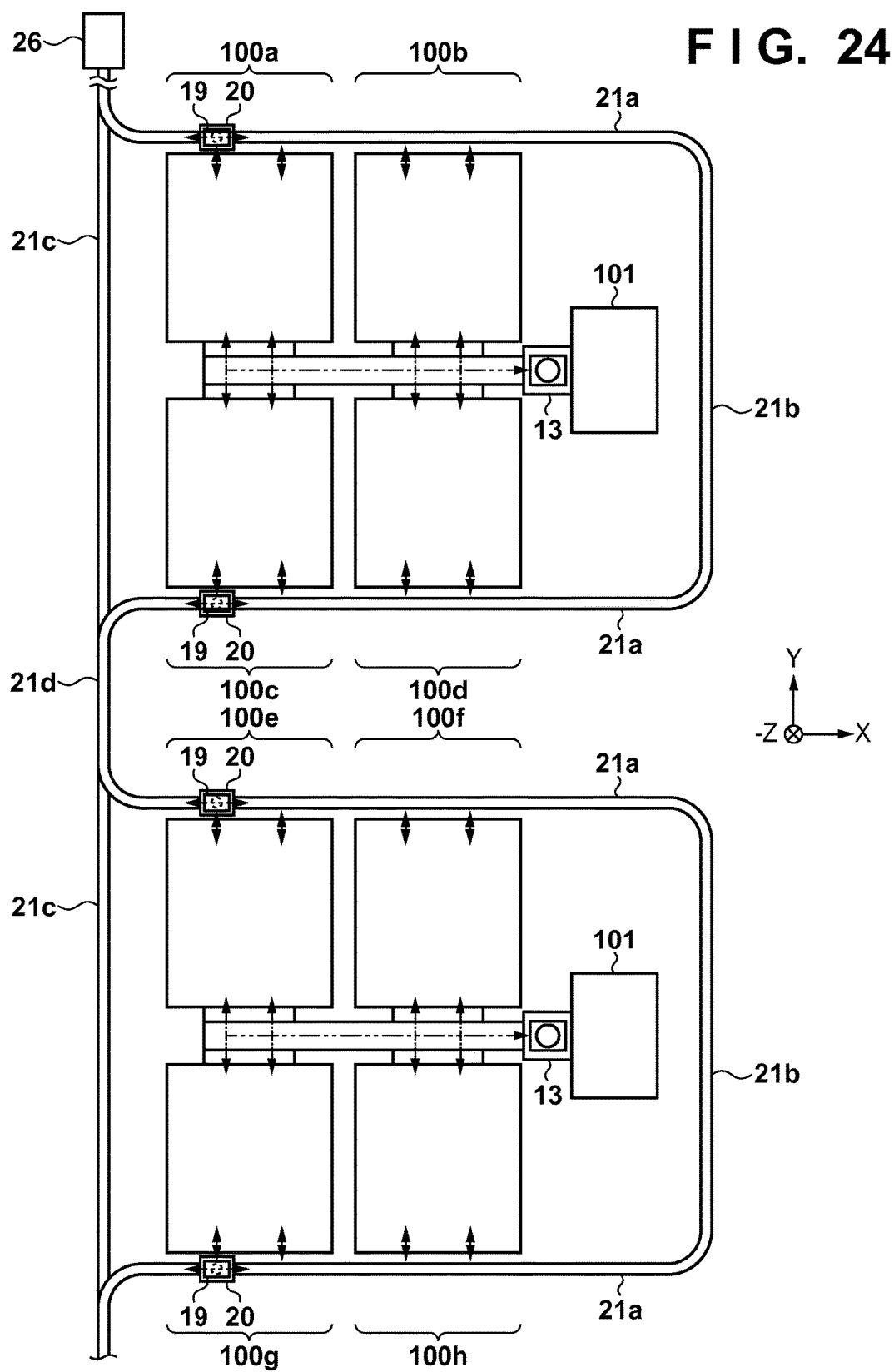
FIG. 24 is a view for explaining an original conveying path according to the first embodiment.

FIG. 24 shows an example of the original conveying path 21 in the imprint apparatus. As shown in FIG. 24, the originals 5 are stored in the original case 19 and conveyed from the original stocker 26 to each imprint unit 100 as the original case 19 moves through the original conveying path 21 while being held on the moveable table 20. The state in which the original 5 is conveyed between the original conveying path 21 and the original stage 5a is shown in FIGS. 7A to 9C. In the imprint apparatus shown in FIG. 24, the four imprint units 100a to 100d are handled as one unit, and the imprint units 100 are arranged by two in two rows along the X direction. A substrate conveying path 27 to convey the substrate 1 is provided along the X direction between the imprint units 100 of two rows. That is, the substrate conveying path 27 extends in the X direction. The adhesion material improves the adhesion between the substrate 1 and the resist. On the other hand, the original conveying path 21 includes two portions (first sections) 21a extending along the X direction on both sides of the imprint units 100 of two rows, and at the ends of the two portions 21a, connecting portions (second and third sections) 21b and 21c that connect the two portions 21a. The two first sections 21a, the second section 21b, and the third section 21c form a circulating path. The two first sections 21a are arranged such that the four imprint units 100a to 100d are located between them. The conveyance directions of the two first section 21a oppose each other. Hence, the original conveying path 21 is common to the eight imprint units 100a to 100h belonging to two units.

In the first embodiment, since the four imprint units 100a to 100d are arranged in two rows, the time from the end of adhesion material coating to the start of the imprint process can greatly be shortened as compared to a case where the imprint units are arranged in one row. For this reason, the adhesion between the substrate 1 and the resin lowers little, and the imprint process can be executed satisfactorily.

If there exist a plurality of units in each of which the four imprint units 100 are arranged by two in two rows along the X direction, the original conveying path 21 also includes a fourth section 21d that connects the original conveying paths of two units adjacent to each other, as shown in FIG. 24. In the first embodiment, since the original conveying path 21 is provided commonly for the eighth imprint units 100a to 100h, the originals 5 can efficiently be conveyed in a small placement area.

In the first embodiment, the substrate conveying path 27 and the original conveying path 21 are arranged on both sides of the imprint units 100 of one row. Hence, for example, if the substrate conveying unit 14 suffers a trouble and is therefore repaired, the original conveying unit 25 does not impede the repairs. The conveyance direction of the substrate 1 and that of the original 5 for one imprint unit 100 oppose each other. In addition, the original conveying path 21 is arranged at a position higher than the substrate conveying path 27.

[Second Embodiment]

Figure 25:
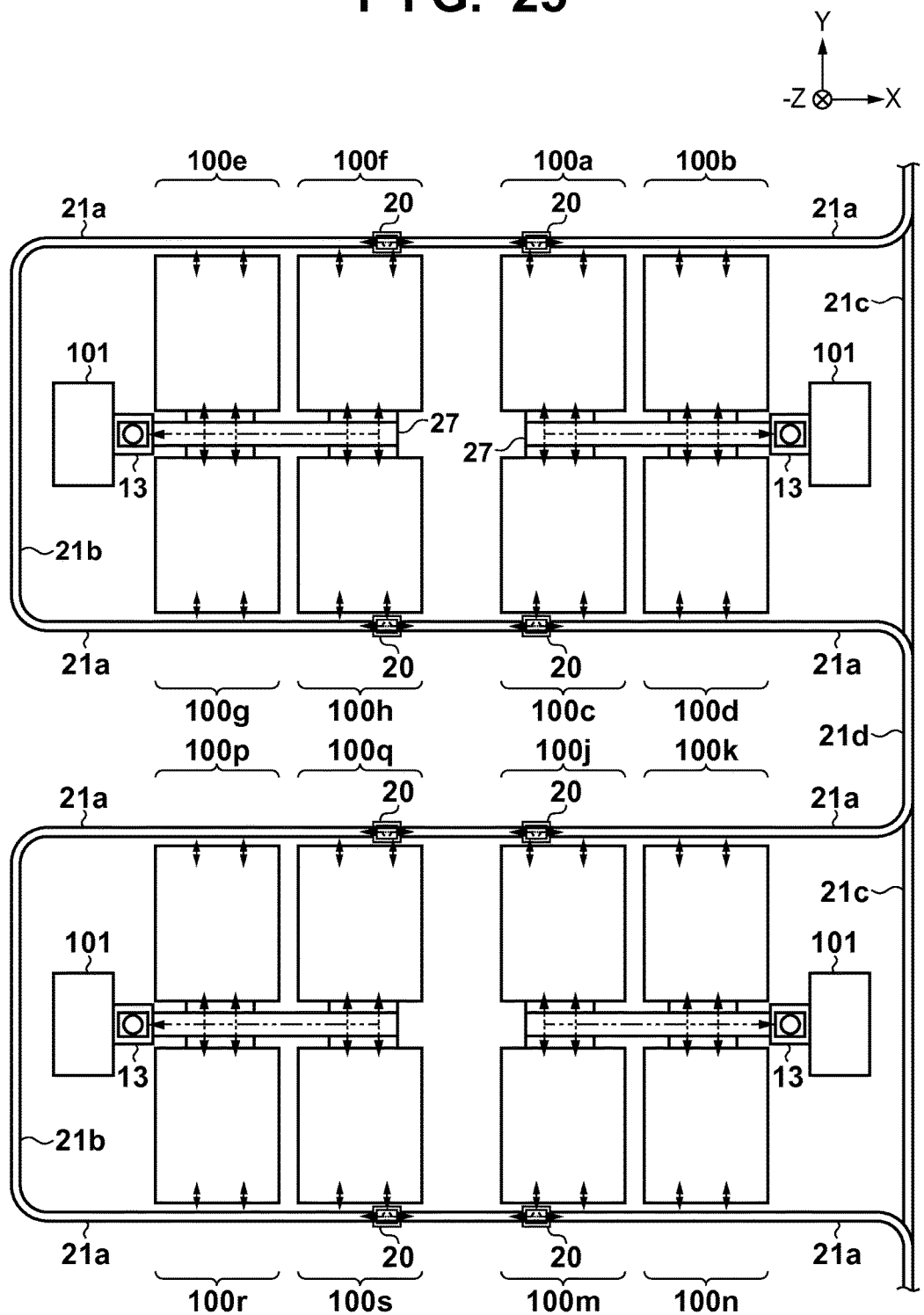
FIG. 25 is a view for explaining an original conveying path according to the second embodiment.

FIG. 25 shows the second embodiment. In the second embodiment, an imprint apparatus includes two units, and each of the two units includes eight imprint units 100, as shown in FIG. 25. In the unit located on the upper side of FIG. 25, eight imprint units 100a to 100h are arranged in two rows at an interval in the Y direction. As shown in FIG. 25, the imprint units 100a, 100b, 100e, and 100f are arranged in one row, and the imprint units 100c, 100d, 100g, and 100h are arranged in another row. A substrate conveying path 27 is provided between the two rows of the imprint units 100. In the second embodiment, the number of imprint units 100 belonging to one unit is 8, that is, twice larger than in the first embodiment. The time from the end of adhesion material coating to the start of an imprint process is almost the same as in the first embodiment. Hence, in the second embodiment, the substrate conveying path 27 of one unit is divided into two sections each of which is provided with a coating device 101 that coats a substrate with the adhesion material and a substrate stocker 13. In the second embodiment as well, the two units are arranged in the Y direction, and original conveying paths 21 of the two units are connected by a fourth section 21d. Hence, the original conveying path 21 is common to the 16 imprint units 100a to 100s belonging to the two units.

[Third Embodiment]

Figure 26:
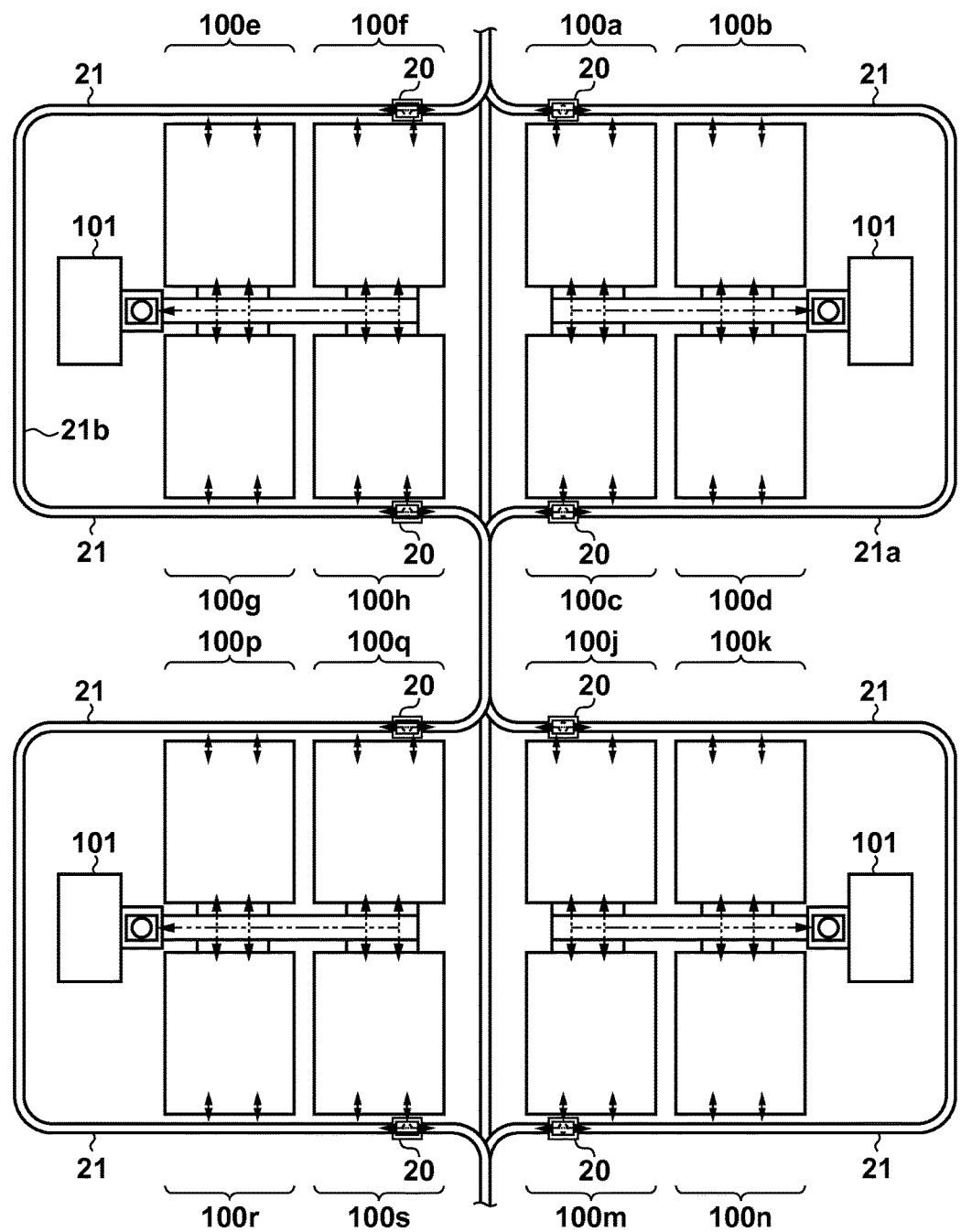
FIG. 26 is a view for explaining an original conveying path according to the third embodiment.

FIG. 26 shows the third embodiment. In FIG. 24, two units are arranged so as to extend in the Y direction (direction perpendicular to the direction in which the substrate conveying paths 27 extend). In the third embodiment, four units are arranged so as to extend in both the X and Y directions, as shown in FIG. 26. In FIG. 26, a fourth section 21d is shared to connect original conveying paths 21 of two units on the right side to each other and connect the original conveying paths 21 of two units on the left side to each other. The placement area of the original conveying path is further reduced by sharing the fourth section 21d.

[Fourth Embodiment]

In the above embodiments, an imprint apparatus for forming a pattern on a substrate by bringing the original 5 into contact with the substrate 1 has been described. However, an original conveying path 21 and a substrate conveying path 27 according to the present invention are also applicable to another lithography apparatus such as an exposure apparatus that projects an original pattern onto a substrate via a projection optical system and forms a pattern on the substrate.

[Article Manufacturing Method]

An article manufacturing method according to an aspect of the present invention is suitable to manufacture an article, for example, a microdevice such as a semiconductor device or an element having a microstructure. The article manufacturing method according to this embodiment includes a step of forming a pattern on a resist coating a substrate using an exposure apparatus or an imprint apparatus, and a step of processing the substrate on which the pattern is formed in the preceding step. The manufacturing method can also include other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-118132, filed Jun. 6, 2014, which is hereby incorporated by reference herein in its entirety.

What is claimed is:

1. A lithography apparatus comprising:
    a plurality of patterning devices arranged in two rows and each configured to perform patterning on one of a plurality of substrates using one of a plurality of originals;
    a substrate conveying path arranged to convey one of the plurality of substrates to one of the plurality of patterning devices, wherein at least a portion of the substrate conveying path is arranged along and between the two rows; and
    an original conveying path arranged to convey one of the plurality of originals to one of the plurality of patterning devices, wherein at least a portion of the original conveying path is arranged along the two rows and opposite to the at least a portion of the substrate conveying path with respect to one of the two rows.

2. The apparatus according to claim 1, wherein the original conveying path includes a connecting portion thereof configured to connect two portions thereof and arranged in the two rows.

3. The apparatus according to claim 2, wherein the original conveying path includes the connecting portion at each of both ends of the two portions.

4. The apparatus according to claim 2, wherein an original stocker is connected to one of the two portions.

5. The apparatus according to claim 1, wherein the substrate conveying path is divided into a plurality of portions thereof, and a substrate stocker is connected to each of the plurality of portions.

6. The apparatus according to claim 1, wherein a plurality of units each including the original conveying path, the substrate conveying path and the plurality of patterning devices are arranged in a direction in which the substrate conveying path extends.

7. The apparatus according to claim 1, wherein a plurality of units each including the original conveying path, the substrate conveying path and the plurality of patterning devices are arranged in a direction intersecting with a direction in which the substrate conveying path extends.

8. The apparatus according to claim 1, wherein at least one of the plurality of patterning devices is configured to form a pattern of an imprint material on the substrate with a mold as the original.

9. The apparatus according to claim 1, wherein at least one of the plurality of patterning devices is configured to expose the substrate to radiant energy via the original.

10. A method of manufacturing an article, the method comprising steps of:
performing patterning on a substrate using a lithography apparatus; and
processing the substrate, that has undergone the patterning, to manufacture the article,
wherein the lithography apparatus includes:
a plurality of patterning devices arranged in two rows and each configured to perform patterning on one of a plurality of substrates using one of a plurality of originals;
a substrate conveying path arranged to convey one of the plurality of substrates to one of the plurality of patterning devices, wherein at least a portion of the substrate conveying path is arranged along and between the two rows; and
an original conveying path arranged to convey one of the plurality of originals to one of the plurality of patterning devices, wherein at least a portion of the original conveying path is arranged along the two rows and opposite to the at least a portion of the substrate conveying path with respect to one of the two rows.

* * * * *